United States Patent
Nishitani et al.

(10) Patent No.: US 10,958,857 B2
(45) Date of Patent: Mar. 23, 2021

(54) IMAGING DEVICE AND IMAGING SYSTEM

(71) Applicant: Panasonic Intellectual Property Management Co., Ltd., Osaka (JP)

(72) Inventors: Takayuki Nishitani, Osaka (JP); Tsutomu Kobayashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/591,657

(22) Filed: Oct. 3, 2019

(65) Prior Publication Data

US 2020/0137332 A1 Apr. 30, 2020

(30) Foreign Application Priority Data

Oct. 25, 2018 (JP) .............................. JP2018-200702
Jun. 13, 2019 (JP) .............................. JP2019-110395

(51) Int. Cl.
*H04N 5/361* (2011.01)
*H04N 5/369* (2011.01)
*H01L 27/146* (2006.01)

(52) U.S. Cl.
CPC ....... *H04N 5/361* (2013.01); *H01L 27/14612* (2013.01); *H01L 27/14621* (2013.01); *H01L 27/14636* (2013.01); *H04N 5/36963* (2018.08)

(58) Field of Classification Search
CPC .. H04N 5/361; H04N 5/36963; H04N 5/3577; H04N 5/378; H01L 27/14612; H01L 27/14612; H01L 27/14636; H01L 27/1463; H01L 27/14643
See application file for complete search history.

(56) References Cited

U.S. PATENT DOCUMENTS

2015/0062396 A1 3/2015 Yamaoka
2017/0223292 A1 8/2017 Ikeda et al.

FOREIGN PATENT DOCUMENTS

| JP | 2008-263072 | 10/2008 |
| JP | 2011-082813 | 4/2011 |
| JP | 2015-050478 | 3/2015 |
| WO | 2016/013413 | 1/2016 |

*Primary Examiner* — Gevell V Selby
(74) *Attorney, Agent, or Firm* — McDermott Will & Emery LLP

(57) ABSTRACT

An imaging device includes a plurality of pixels, a first circuit, a first signal path, and a second signal path. The plurality of pixels includes a first pixel and a second pixel. The first circuit includes a first wiring part and a second wiring part. A signal of the first pixel flows through the first signal path. A signal of the second pixel flows through a second signal path. In a flow of the signal of the first pixel, a first crossing portion is located upstream of a first extension portion. In a flow of the signal of the second pixel, a second crossing portion is located upstream of a second extension portion.

19 Claims, 27 Drawing Sheets

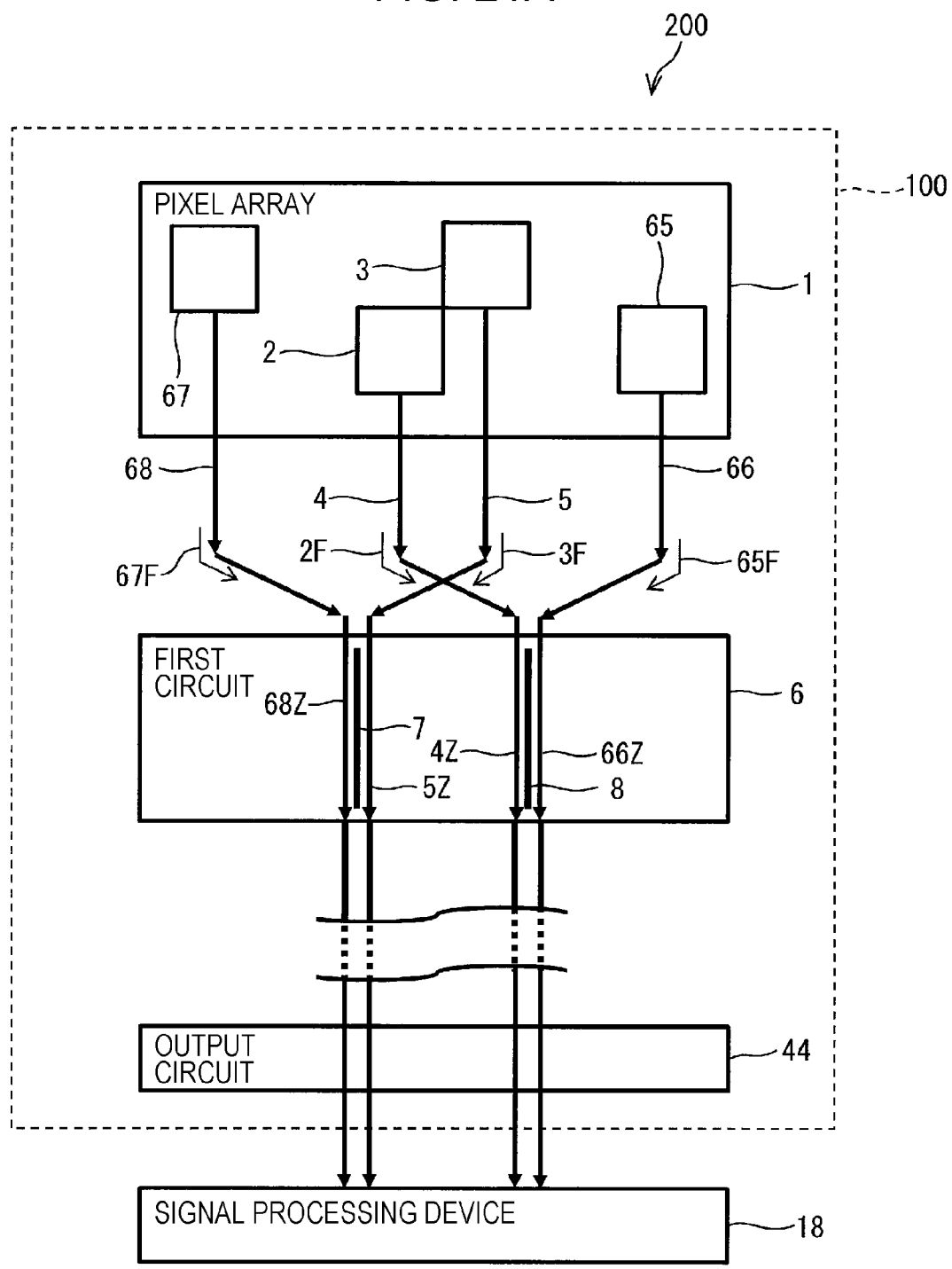

IMAGING DEVICE AND IMAGING SYSTEM

BACKGROUND

1. Technical Field

The present disclosure relates to an imaging device and an imaging system.

2. Description of the Related Art

There have been known various imaging devices. An example of an imaging device is a CMOS (complementary metal oxide semiconductor) image sensor. A CMOS image sensor according to an example includes groups of readout circuits for each separate column and outputs digital signals subjected to AD conversion on a row-by-row basis. Japanese Unexamined Patent Application Publication No. 2011-082813 discloses an example of a CMOS image sensor.

SUMMARY

There is a case where an imaging device has a plurality of voltage lines to which different voltages are applied. From those voltage lines, different noise components are supplied to signals of pixels, whereby there may be deterioration in image quality. One non-limiting and exemplary embodiment provides techniques that can be useful in noise reduction in the presence of a plurality of voltage lines to which different voltages are applied.

In one general aspect, the techniques disclosed here feature an imaging device including: a plurality of pixels including a first pixel and a second pixel; a first circuit including a first wiring part and a second wiring part, the first wiring part including one or more first voltage lines to which a first voltage is applied, the second wiring part including one or more second voltage lines to which a second voltage is applied, the second voltage being different from the first voltage; a first signal path through which a signal of the first pixel flows; and a second signal path through which a signal of the second pixel flows, wherein when in a plan view a region closer to each of the one or more first voltage lines than any of the one or more second voltage lines is defined as a first region and a region closer to each of the one or more second voltage lines than any of the one or more first voltage lines is defined as a second region, the first signal path includes a first crossing portion where the first signal path crosses the second signal path in the plan view and a first extension portion that extends within the second region in the plan view and the second signal path includes a second crossing portion where the second signal path crosses the first signal path in the plan view and a second extension portion that extends within the first region in the plan view, in a flow of the signal of the first pixel, the first crossing portion is located upstream of the first extension portion, and in a flow of the signal of the second pixel, the second crossing portion is located upstream of the second extension portion.

The techniques disclosed here can be useful in noise reduction in the presence of a plurality of voltage lines to which different voltages are applied. It should be noted that general or specific embodiments may be implemented as a device, an apparatus, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 21A is an explanatory diagram of signal paths according to a fourth embodiment;

DETAILED DESCRIPTION

Figure 1:
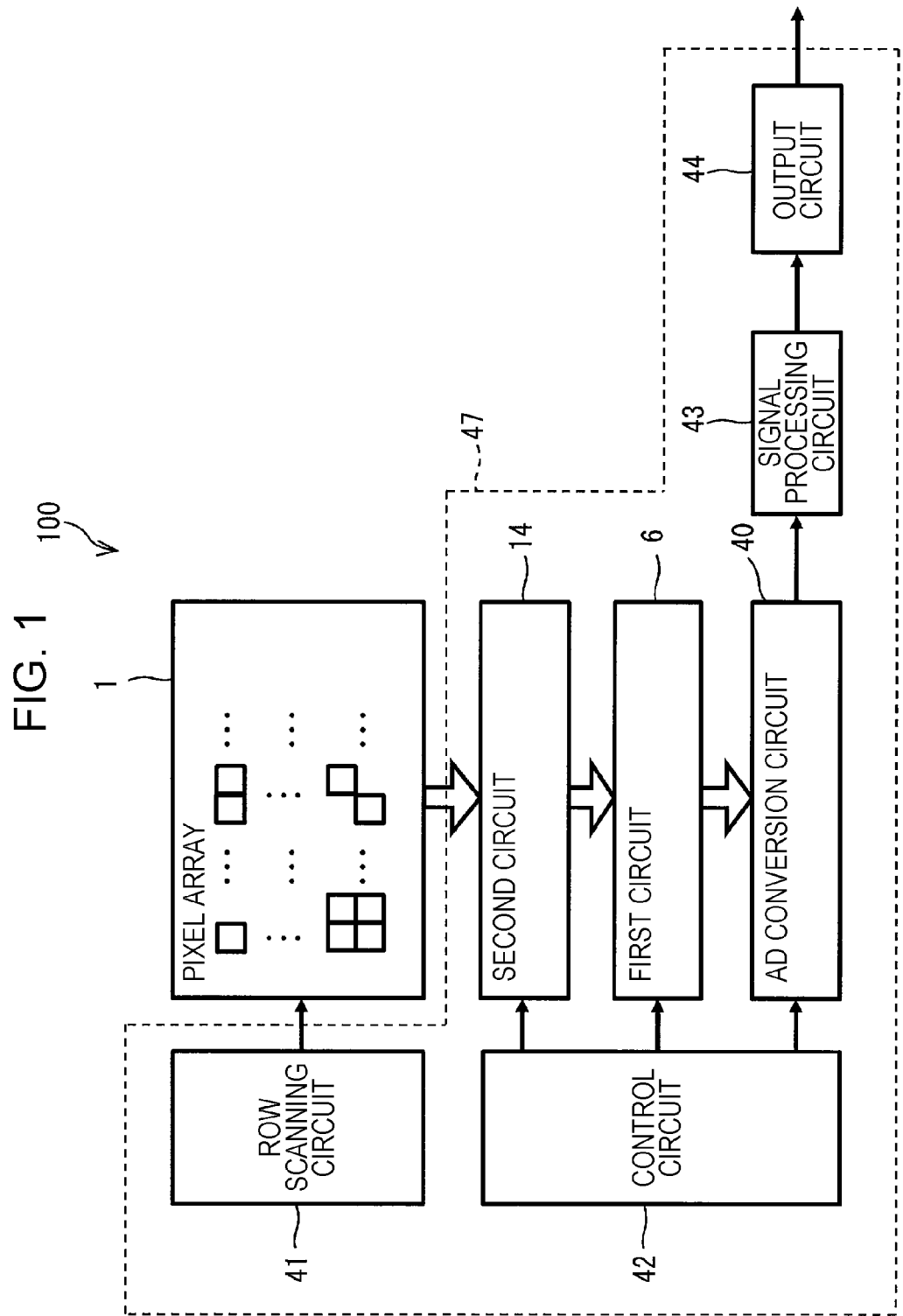
FIG. 1 is a block diagram of an imaging device according to a first embodiment.

Brief Overview of Aspects of the Present Disclosure

According to a first aspect of the present disclosure, there is provided an imaging device including:

a plurality of pixels including a first pixel and a second pixel;

a first circuit including a first wiring part and a second wiring part, the first wiring part including one or more first voltage lines to which a first voltage is applied, the second wiring part including one or more second voltage lines to which a second voltage is applied, the second voltage being different from the first voltage;

a first signal path through which a signal of the first pixel flows; and a second signal path through which a signal of the second pixel flows, wherein when in a plan view a region closer to each of the one or more first voltage lines than any of the one or more second voltage lines is defined as a first region and a region closer to each of the one or more second voltage lines than any of the one or more first voltage lines is defined as a second region, the first signal path includes a first crossing portion where the first signal path crosses the second signal path in the plan view and a first extension portion that extends within the second region in the plan view and the second signal path includes a second crossing portion where the second signal path crosses the first signal path in the plan view and a second extension portion that extends within the first region in the plan view, in a flow of the signal of the first pixel, the first crossing portion is located upstream of the first extension portion, and in a flow of the signal of the second pixel, the second crossing portion is located upstream of the second extension portion.

The technique according to the first aspect can be useful in noise reduction in the presence of a plurality of voltage lines to which different voltages are applied. A "signal path" as is defined here encompasses one or more signal lines through which a signal flows. A part of a "signal path" may be a signal line included in the first circuit and/or the after-mentioned second circuit.

A second aspect of the present disclosure may be directed, for example, to the imaging device according to the first aspect, wherein the first voltage is a power supply voltage, and the second voltage is a ground voltage.

The technique according to the second aspect can be useful in noise reduction in the presence of a voltage line to which a power supply voltage is applied and a voltage line to which a ground voltage is applied.

A third aspect of the present disclosure may be directed, for example, to the imaging device according to the first or second aspect, wherein the plurality of pixels constitute a pixel array having at least one row and a plurality of columns, and a column of the pixel array to which the first pixel belongs and a column of the pixel array to which the second pixel belongs are adjacent to each other.

The layout of the third aspect is a specific example of the layout of the imaging device.

A fourth aspect of the present disclosure may be directed, for example, to the imaging device according to any one of the first to third aspects, wherein in the plan view, the one or more first voltage lines, the one or more second voltage lines, the first extension portion, and the second extension portion extend parallel to one another.

The parallel layout of the fourth aspect is advantageous in terms of miniaturization. Meanwhile, this parallel layout is not necessarily advantageous in terms of noise reduction. For this reason, in this parallel layout, the aforementioned noise reduction easily exerts its effects.

A fifth aspect of the present disclosure may be directed, for example, to the imaging device according to any one of the first to fourth aspects, further including a multi-layer wiring layer including a first wiring layer and a second wiring layer that is different from the first wiring layer, wherein the first wiring layer includes the first crossing portion, and the second wiring layer includes the second crossing portion.

The fifth aspect makes it easy to achieve the crossing of the first signal path and the second signal path in the plan view.

A sixth aspect of the present disclosure may be directed, for example, to the imaging device according to any one of the first to fifth aspects, wherein in the plan view, the first signal path further includes a first node and a second node, in the plan view, the second signal path further includes a third node and a fourth node, in the flow of the signal of the first pixel, the first node is located upstream of the first crossing portion and the second node is located between the first crossing portion and the first extension portion, and in the flow of the signal of the second pixel, the third node is located upstream of the second crossing portion and the fourth node is located between the second crossing portion and the second extension portion, the imaging device further including a selector, wherein the selector includes a first switch connected between the first node and the fourth node, a second switch connected between the first node and the second node, a third switch connected between the third node and the fourth node, and a fourth switch connected between the third node and the second node.

The sixth aspect makes it possible to switch paths of signals of pixels.

A seventh aspect of the present disclosure may be directed, for example, to the imaging device according to any one of the first to sixth aspects, further including a second circuit including a third wiring part including one or more voltage lines and a fourth wiring part including a plurality of voltage lines, wherein the one or more of voltage lines of the third wiring part include a third voltage line, the plurality of voltage lines of the fourth wiring part include a fourth voltage line and a fifth voltage line that are adjacent to the third voltage line, the third voltage line is located between the fourth voltage line and the fifth voltage line, in the plan view, a pitch between the one or more first voltage lines and the one or more second voltage lines and a pitch between the third voltage line and each of the fourth and fifth voltage lines are different from each other, when in the plan view a region between the third voltage line and the fourth voltage line is defined as a first pitch region and a region between the third voltage line and the fifth voltage line is defined as a second pitch region, the first signal path further includes a first pitch portion that extends within the first pitch region in the plan view and the second signal path further includes a second pitch portion that extends within the second pitch region in the plan view, in the flow of the signal of the first pixel, the first pitch portion is located upstream of the first crossing portion, and in the flow of the signal of the second pixel, the second pitch portion is located upstream of the second crossing portion.

A case where there is a difference in pitch of the seventh aspect is an example of a case where a layout accompanied by the aforementioned crossing can contribute to noise reduction.

An eighth aspect of the present disclosure may be directed, for example, to the imaging device according to any one of the first to seventh aspects, wherein the first circuit further includes a first transistor of a first conductivity type and a second transistor of a second conductivity type that is different from the first conductivity type, the first transistor is connected to any of the one or more first voltage lines, and the second transistor is connected to any of the one or more second voltage lines.

The eighth aspect makes it possible to actuate the first transistor by utilizing the first voltage of the first voltage line, and also makes it possible to actuate the second transistor by utilizing the second voltage of the second voltage line.

A ninth aspect of the present disclosure may be directed, for example, to the imaging device according to any one of the first to sixth aspects, further including a second circuit, wherein the first circuit further includes a first transistor of a first conductivity type and a second transistor of a second conductivity type that is different from the first conductivity type, the second circuit includes a third transistor of the first conductivity type and a fourth transistor of the second conductivity type, when a center of gravity of a gate of the first transistor and a gate of the second transistor is defined as a first center of gravity and a center of gravity of a gate of the third transistor and a gate of the fourth transistor is defined as a second center of gravity, a direction of arrangement of the first transistor and the second transistor and a direction of arrangement of the third transistor and the fourth transistor are different from each other in the plan view, in the plan view, the first signal path includes a portion that is closest to the second center of gravity and a portion that is closest to the first center of gravity, in the plan view, the second signal path includes a portion that is closest to the second center of gravity and a portion that is closest to the first center of gravity, in the flow of the signal of the first pixel, the portion of the first signal path that is closest to the second center of gravity is located upstream of the portion of the first signal path that is closest to the first center of gravity, and in the flow of the signal of the second pixel, the portion of the second signal path that is closest to the second center of gravity is located upstream of the portion of the second signal path that is closest to the first center of gravity.

A case where there is a difference in direction of arrangement of the transistors of the ninth aspect is an example of a case where a layout accompanied by the aforementioned crossing can contribute to noise reduction.

A tenth aspect of the present disclosure may be directed, for example, to the imaging device according to any one of the first to ninth aspects, wherein the plurality of pixel include a first OB pixel, the first OB pixel being an optical black pixel, the imaging device further including:

a signal processing circuit; and a first OB path through which a signal of the first OB pixel flows, wherein in the plan view, the first OB path includes a first OB extension portion that extends within the second region, and the signal processing circuit performs an optical black correction on the signal of the first pixel with use of the signal of the first OB pixel, the signal of the first pixel having passed through the first extension portion, the signal of the first OB pixel having passed through the first OB extension portion.

The tenth aspect is suitable to reducing a noise component superimposed on the signal of the first pixel in the second region. An "OB path" as is defined here encompasses one or more signal lines through which a signal flows. A part of an "OB path" may be a signal line included in the first circuit and/or the after-mentioned second circuit.

An eleventh aspect of the present disclosure may be directed, for example, to the imaging device according to any one of the first to ninth aspects, wherein the plurality of pixels include a third pixel, the imaging device further including a third signal path through which a signal of the third pixel flows, wherein in the plan view, the third signal path includes a third extension portion that extends within the second region.

The eleventh aspect makes it easy to make corrections for reducing the noise of the signal of the first pixel and the signal of the third pixel.

A twelfth aspect of the present disclosure may be directed, for example, to the imaging device according to the eleventh aspect, wherein the plurality of pixels include a fourth pixel, the imaging device further including a fourth signal path through which a signal of the fourth pixel flows, wherein in the plan view, the fourth signal path includes a fourth extension portion that extends within the first region.

The twelfth aspect makes it easy to make corrections for reducing the noise of the signal of the second pixel and the signal of the fourth pixel.

A thirteenth aspect of the present disclosure may be directed, for example, to the imaging device according to the twelfth aspect, wherein in the plan view, the third signal path includes a portion that extends from the third pixel to the second region, in the plan view, the fourth signal path includes a portion that extends from the fourth pixel to the first region, and the portion that extends from the third pixel to the second region does not cross the portion that extends from the fourth pixel to the first region.

The layout of the thirteenth aspect is an example of the layout of the imaging device.

A fourteenth aspect of the present disclosure may be directed, for example, to the imaging device according to any one of the eleventh to thirteenth aspects, wherein
the first pixel includes a first color filter,
the second pixel includes a second color filter,
the third pixel includes a third color filter,
the first color filter and the third color filter are color filters of a first color, and
the second color filter is a color filter of a second color that is different from the first color.

The fourteenth aspect is suitable to reducing the noise of the signals of the first and third pixels, which are pixels including color filters of the first color, under the same correction conditions.

A fifteenth aspect of the present disclosure may be directed, for example, to the imaging device according to any one of the eleventh to thirteenth aspects, wherein
the first pixel and the third pixel are each a first type of pixel selected from among four types of pixel consisting of an R pixel, a B pixel, a Gr pixel, and a Gb pixel,
the second pixel is a second type of pixel selected from among four types of pixel consisting of an R pixel, a B pixel, a Gr pixel, and a Gb pixel, and
the first type of pixel and the second type of pixel are different from each other.

The fifteenth aspect is suitable to reducing the noise of the signals of the first and third pixels, each of which is a first type of pixel, under the same correction conditions.

A sixteenth aspect of the present disclosure may be directed, for example, to the imaging device according to any one of the eleventh to fifteenth aspects, further including a signal processing circuit,
wherein the signal processing circuit performs, on both the signal of the first pixel and the signal of the third pixel, corrections that reduce noise components that are superimposed in the second region, the signal of the first pixel having passed through the first extension portion, the signal of the third pixel having passed through the third extension portion.

The sixteenth aspect makes it easy to apply the same correction conditions to the correction to the signal of the first pixel and the correction to the signal of the third pixel.

A seventeenth aspect of the present disclosure may be directed, for example, to the imaging device according to any one of the eleventh to fifteenth aspects, wherein
the plurality of pixel include a first OB pixel, the first OB pixel being an optical black pixel,
the imaging device further including:
a signal processing circuit; and
a first OB path through which a signal of the first OB pixel flows,
wherein in the plan view, the first OB path includes a first OB extension portion that extends within the second region, and
the signal processing circuit performs an optical black correction on the signal of the first pixel with use of the signal of the first OB pixel, the signal of the first pixel having passed through the first extension portion, the signal of the first OB pixel having passed through the first OB extension portion.

The seventeenth aspect is suitable to reducing a noise component superimposed on the signal of the first pixel in the second region.

According to an eighteenth aspect of the present disclosure, there is provided an imaging system including:
the imaging device according to any one of the first to ninth and eleventh to fifteenth aspects; and
a signal processing device provided outside the imaging device,
wherein the plurality of pixel include a first OB pixel, the first OB pixel being an optical black pixel,
the imaging device further includes a first OB path through which a signal of the first OB pixel flows,
in the plan view, the first OB path includes a first OB extension portion that extends within the second region, and
the signal processing device performs an optical black correction on the signal of the first pixel with use of the signal of the first OB pixel, the signal of the first pixel having passed through the first extension portion, the signal of the first OB pixel having passed through the first OB extension portion.

The eighteenth aspect is suitable to reducing a noise component superimposed on the signal of the first pixel in the second region.

According to a nineteenth aspect of the present disclosure, there is provided an imaging system including:
the imaging device according to any one of the eleventh to fifteenth aspects; and
a signal processing device provided outside the imaging device,
wherein the signal processing device performs, on both the signal of the first pixel and the signal of the third pixel, corrections that reduce noise components that are superimposed in the second region, the signal of the first pixel having passed through the first extension portion, the signal of the third pixel having passed through the third extension portion.

The nineteenth aspect makes it easy to apply the same correction conditions to the correction to the signal of the first pixel and the correction to the signal of the third pixel.

According to a twentieth aspect of the present disclosure, there is provided an imaging device including:
a plurality of pixels including a first pixel, a second pixel, a third pixel, and a fourth pixel;
a first circuit including a first wiring part and a second wiring part, the first wiring part including one or more first voltage lines to which a first voltage is applied, the second wiring part including one or more second voltage lines to which a second voltage is applied, the second voltage being different from the first voltage;
a first signal path through which a signal of the first pixel flows;
a second signal path through which a signal of the second pixel flows;
a third signal path through which a signal of the third pixel flows; and
a fourth signal path through which a signal of the fourth pixel flows,
wherein when in a plan view a region closer to each of the one or more first voltage lines than any of the one or more second voltage lines is defined as a first region and a region closer to each of the one or more second voltage lines than any of the one or more first voltage lines is defined as a second region, the first signal path includes a first extension portion that extends within the second region in the plan view, the second signal path includes a second extension portion that extends within the first region in the plan view, the third signal path includes a third extension portion that extends within the second region in the plan view, and the fourth signal path includes a fourth extension portion that extends within the first region in the plan view.

A twenty-first aspect of the present disclosure may be directed, for example, to the imaging device according to the twentieth aspect, wherein the first pixel includes a first color filter,
the second pixel includes a second color filter,
the third pixel includes a third color filter,
the fourth pixel includes a fourth color filter,
the first color filter and the third color filter are color filters of a first color, and
the second color filter and the fourth color filter are color filters of a second color that is different from the first color.

A twenty-second aspect of the present disclosure may be directed, for example, to the imaging device according to the twentieth aspect, wherein the first pixel and the third pixel are each a first type of pixel selected from among four types of pixel consisting of an R pixel, a B pixel, a Gr pixel, and a Gb pixel, the second pixel and the fourth pixel are each a second type of pixel selected from among four types of pixel consisting of an R pixel, a B pixel, a Gr pixel, and a Gb pixel, and the first type of pixel and the second type of pixel are different from each other.

A twenty-third aspect of the present disclosure may be directed, for example, to the imaging device according to any one of the twentieth to twenty-second aspects, further including a signal processing circuit, wherein the signal processing circuit performs, on both the signal of the first pixel and the signal of the third pixel, corrections that reduce noise components that are superimposed in the second region, the signal of the first pixel having passed through the first extension portion, the signal of the third pixel having passed through the third extension portion, and the signal processing circuit performs, on both the signal of the second pixel and the signal of the fourth pixel, corrections that reduce noise components that are superimposed in the first region, the signal of the second pixel having passed through the second extension portion, the signal of the fourth pixel having passed through the fourth extension portion.

According to a twenty-fourth aspect of the present disclosure, there is provided an imaging system including:

the imaging device according to any one of the twentieth to twenty-third aspects; and a signal processing device provided outside the imaging device, wherein the signal processing device performs, on both the signal of the first pixel and the signal of the third pixel, corrections that reduce noise components that are superimposed in the second region, the signal of the first pixel having passed through the first extension portion, the signal of the third pixel having passed through the third extension portion, and the signal processing device performs, on both the signal of the second pixel and the signal of the fourth pixel, corrections that reduce noise components that are superimposed in the first region, the signal of the second pixel having passed through the second extension portion, the signal of the fourth pixel having passed through the fourth extension portion.

The techniques of the first to nineteenth aspects are applicable to the twentieth to twenty-fourth aspects.

Imaging devices according to embodiments are described below with reference to the drawings.

There is a case where an unnecessarily detailed description is omitted. For example, there is a case where a detailed description of a matter that has already been well known, a repeated description of substantially the same components, or other descriptions is omitted. This is intended to avoid unnecessary redundancy of the following description to facilitate understanding of persons skilled in the art. It should be noted that the accompanying drawings and the following description are intended to help persons skilled in the art to fully understand the techniques disclosed here, and are not intended to limit the subject matters recited in the claims.

In the drawings, elements representing substantially the same components, actions, and effects are given the same signs. Further, all of the numerical values to be described below are exemplified in order to specifically describe the techniques disclosed here, and the techniques disclosed here are not limited to the numerical values thus exemplified. Furthermore, the relationship of connection between constituent elements is exemplified in order to specifically describe the techniques disclosed here, and is not the only relationship of connection that achieves the functions of the techniques disclosed here.

Ordinal numerals such as "first, second, third, . . . " are sometimes used herein. In a case where an element is given an ordinal numeral, it is not essential that an element of the same type with a lower number be present. Numbers of ordinal numerals are subject to change as needed.

First Embodiment

Figure 2:
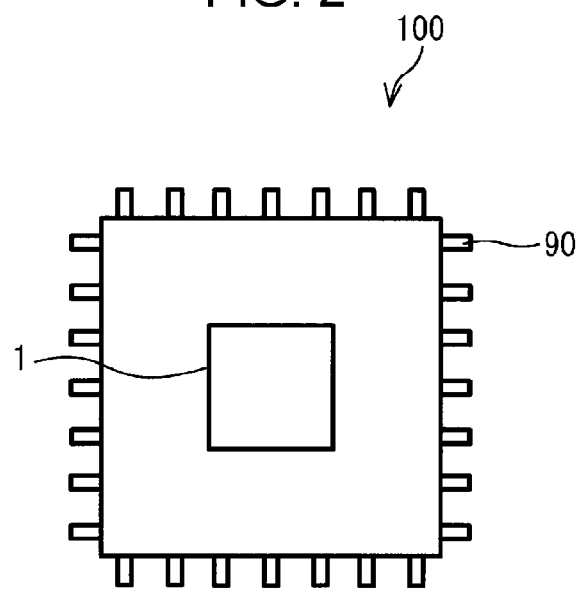
FIG. 2 is a diagram showing a specific example of the imaging device according to the first embodiment.

FIG. 1 shows an imaging device 100 according to a first embodiment. The imaging device 100 is for example an image sensor chip shown in FIG. 2.

As shown in FIG. 1, the imaging device 100 includes a pixel array 1 and an electric circuit 47. The pixel array 1 refers to an element the number of whose columns may be one or more and the number of whose rows may be one or more. In the example shown in FIG. 1, the electric circuit 47 is a peripheral circuit.

Figure 3:
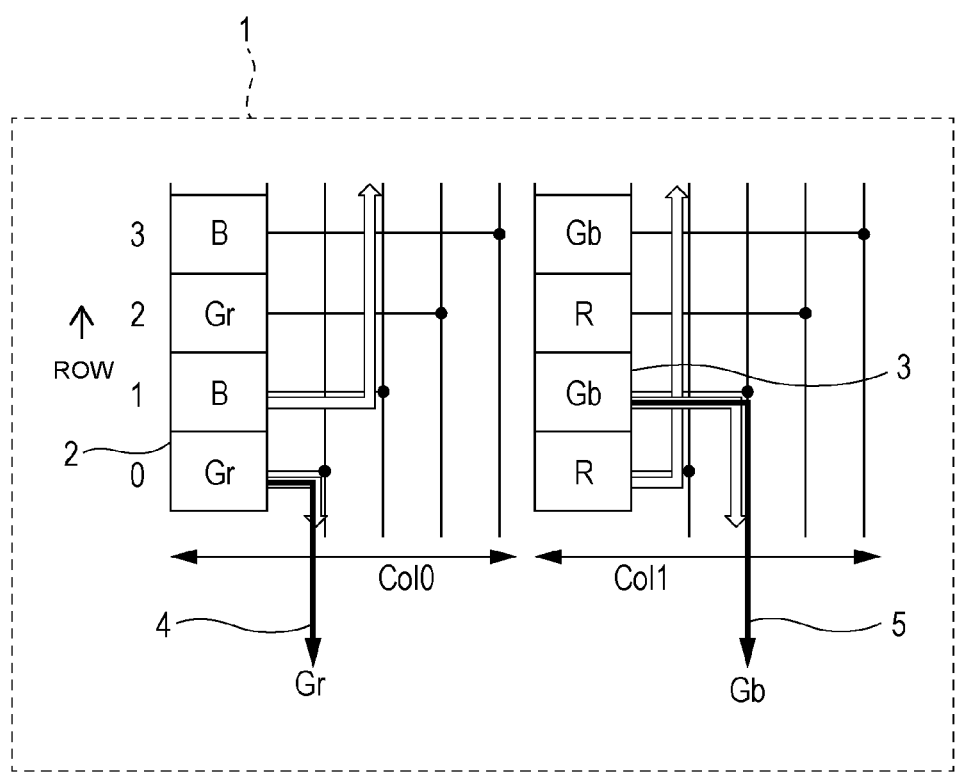
FIG. 3 is a configuration diagram of a pixel array according to the first embodiment.

The pixel array 1 includes a plurality of pixels. FIG. 3 shows an example of the pixel array 1. In the example shown in FIG. 3, the pixels of the pixel array 1 are arranged in rows and columns on a semiconductor substrate. A region in which these pixels are provided functions as an imaging region. Each of the pixels generates an electric charge by photoelectrically converting incident light and outputs the resulting pixel signal (which exemplifies the signals of the first to fourth pixels of the present disclosure). The pixel signal is an electric signal that corresponds to the electric charge.

In FIG. 3, the legend "Row" represents the rows of the pixel array 1. The legend "Col" represents the columns of the pixel array 1. FIG. 3 illustrates the zeroth row, the first row, the second row, and the third row. In FIG. 3, the legend "Col0" represents the zeroth column, and the legend "Col1" represents the first column.

In the example shown in FIG. 3, the pixel array 1 employs a Bayer arrangement. Specifically, for example, in each of the even-numbered rows such as the zeroth row and the second row, a Gr pixel and an R pixel are alternately and repeatedly arranged. In each of the odd-numbered rows such as the first row and the third row, a B pixel and a Gb pixel are alternately and repeatedly arranged. In each of the even-numbered columns such as the zeroth column, a Gr pixel and a B pixel are alternately and repeatedly arranged.

In each of the odd-numbered columns such as the first column, an R pixel and a Gb pixel are alternately and repeatedly arranged.

The R pixels are red pixels. The B pixels are blue pixels. The Gr pixels and the Gb pixels are green pixels.

Specifically, for example, the R pixels include R color filters. The R color filters are red color filters. The B pixels include B color filters. The B color filters are blue color filters. The Gr pixels include Gr color filters. The Gb pixels include Gb color filters. The Gr color filters and the Gb color filters are green color filters.

In the example shown in FIG. 3, the pixels are color pixels. Specifically, in the example shown in FIG. 3, the pixels are primary color pixels. Note, however, that the pixels may be complimentary color pixels. Further, in the example shown in FIG. 3, the pixel array 1 is constituted by pixels of a plurality of colors that differ. Specifically, in the example shown in FIG. 3, the plurality of colors are three colors. Note, however, that the plurality of colors may be four colors. The plurality of colors may include white. Alternatively, the pixels may be filterless monochromatic pixels. The same applies to the embodiments to be described below.

Figure 5:
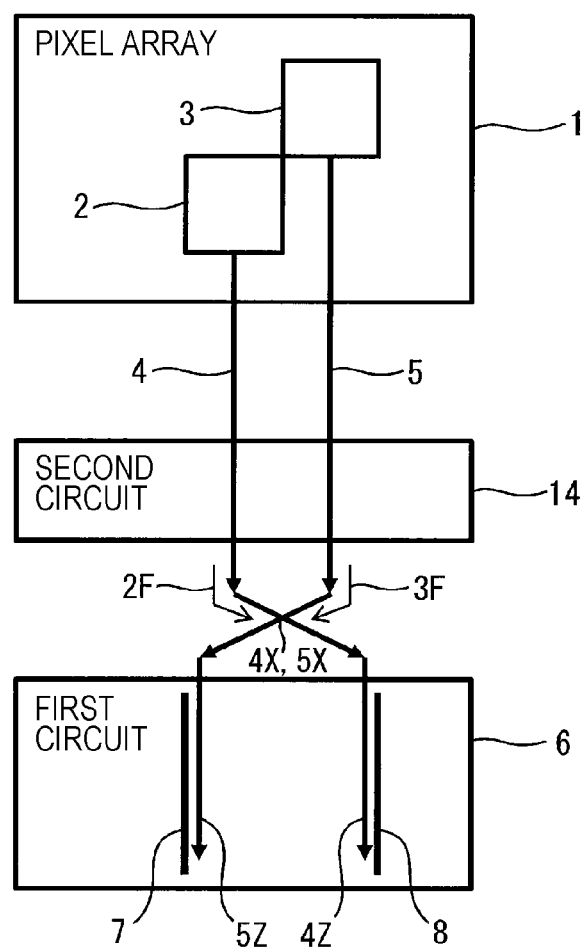
FIG. 5 is an explanatory diagram of signal paths according to the first embodiment.

In the example shown in FIG. 3, one pixel is connected to one signal line, and there are a plurality of such combinations of a pixel and a signal line. In FIG. 3, each of the signal lines vertically extends. In the example shown in FIG. 3, a plurality of signal lines are associated with the zeroth column, and a plurality of signal lines are associated with the first column. These signal lines constitute some or all of signal paths through which signals of the pixels flow. FIG. 5 or other drawings to be described below may omit to illustrate some of these signal lines or signal paths. It should be noted that a plurality of signal lines associated with one column may converge halfway into a smaller number of signal lines. The number of signal lines that are associated with one column may be one.

In the first embodiment, each of the pixels has its center located on a lattice point of an imaginary square lattice. Of course, each of the pixels may have its center located on a lattice point of an imaginary triangular lattice, an imaginary hexagonal lattice, or other imaginary lattices. Further, the pixels may be one-dimensionally arranged. In this case, the imaging device 100 can be utilized as a line sensor.

In the example shown in FIG. 1, the electric circuit 47 includes a second circuit 14, a first circuit 6, an AD conversion circuit 40, a signal processing circuit 43, an output circuit 44, a row scanning circuit 41, and a control circuit 42. The electric circuit 47 may be placed on the semiconductor substrate on which the pixel array 1 is formed. A part of the electric circuit 47 may be placed on a different substrate.

The row scanning circuit 41 selects some rows of pixels from among the plurality of pixels of the pixel array 1. As a result, a readout of signals of the pixels thus selected is executed.

Figure 4:
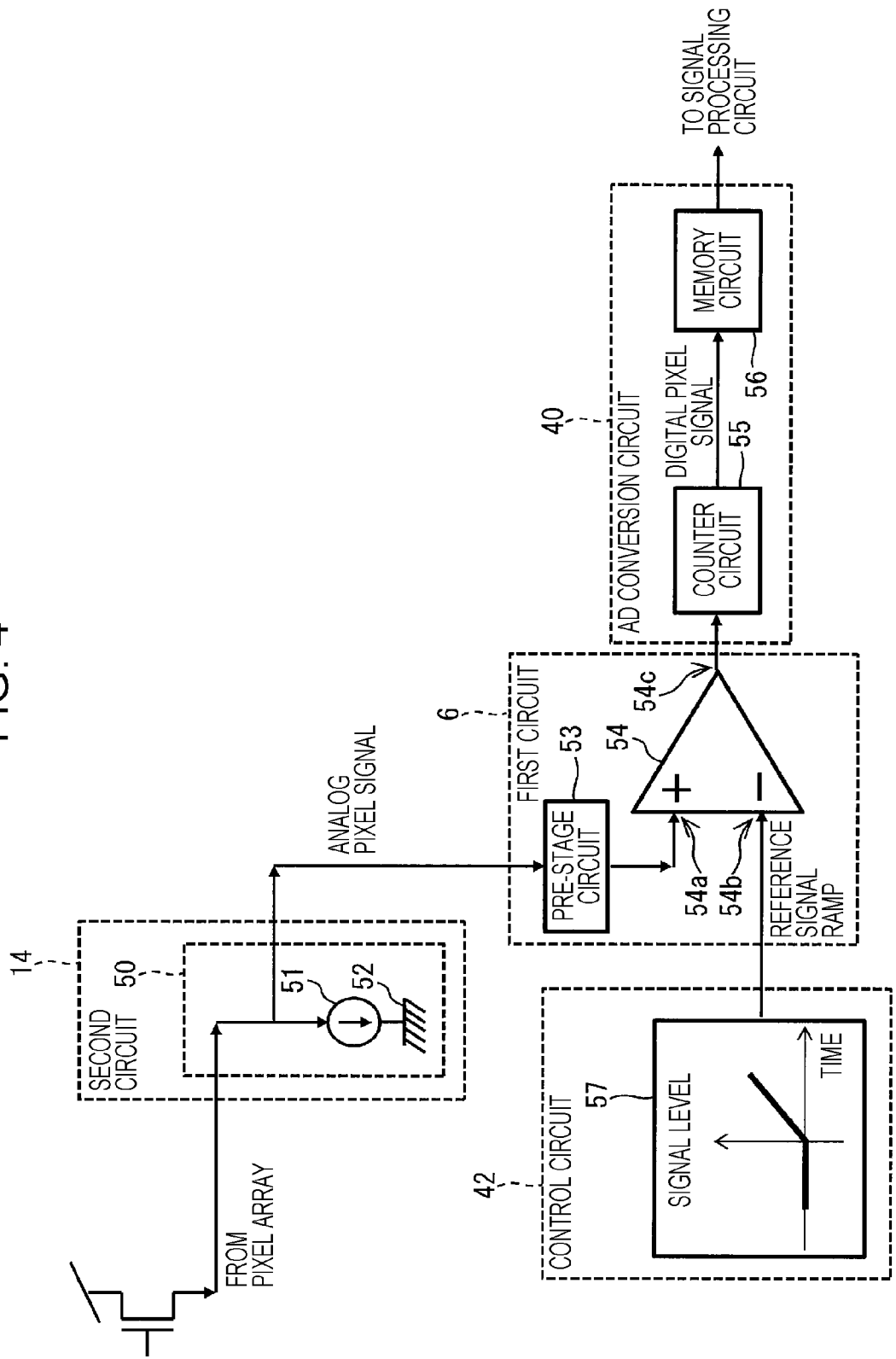
FIG. 4 is a configuration diagram of a second circuit, a first circuit, an AD conversion circuit, and a control circuit according to the first embodiment.

FIG. 4 schematically shows an example configuration of the second circuit 14, the first circuit 6, the AD conversion circuit 40, and the control circuit 42.

In the example shown in FIG. 4, the second circuit 14 includes a current source circuit 50. The current source circuit 50 includes a constant current source 51. The constant current source 51 is connected to a ground 52.

The first circuit 6 includes a pre-stage circuit 53 and a RAMP comparator 54. The pre-stage circuit 53 includes a buffer circuit. The RAMP comparator 54 includes a first input 54a, a second input 54b, and an output 54c.

The AD conversion circuit 40 includes a counter circuit 55 and a memory circuit 56. The counter circuit 55 includes an AD conversion clock.

The control circuit 42 includes a digital-analog converter (DAC) 57. The control circuit 42 controls the second circuit 14, the first circuit 6, and the AD conversion circuit 40.

Signals of a certain column of pixels of the pixel array 1 are inputted to the current source circuit 50. The current source circuit 50 utilizes the constant current source 51 to output, as analog voltage signals, signals corresponding to the signals of the pixels thus inputted. The signals of the pixels, which have turned into voltage signals, are inputted to the first input 54a of the RAMP comparator 54 via the pre-stage circuit 53.

The DAC 57 outputs a reference signal RAMP. The reference signal RAMP is a voltage signal that varies with time. In one example, the reference signal RAMP is a voltage signal that increases with time. In another example, the reference signal RAMP is a voltage signal that decreases with time. A change in a voltage signal may be a monotonic increase or may be a monotonic decrease. A change in a voltage signal may be a linear change. The reference signal RAMP is inputted to the second input 54b of the RAMP comparator 54.

A voltage is outputted as an output signal from the output 54c of the RAMP comparator 54. In one example, a high-level voltage or a low-level voltage is outputted from the output 54c. The voltage level is inverted when the sign of the difference between an input voltage to the first input 54a and an input voltage to the second input 54b is inverted.

The counter circuit 55 uses the AD conversion clock to count a period from a point of time at which a change in a voltage signal from the RAMP comparator 54 starts to an occurrence of the aforementioned inversion. The counter circuit 55 outputs a larger digital signal when the period of time thus counted is longer. In this way, the signals of the pixels are converted from analog signals into digital signals by the RAMP comparator 54 and the counter circuit 55.

The signals of the pixels, which have turned into digital signals, are stored in the memory circuit 56. The signals of the pixels stored in the memory circuit 56 are subjected to signal processing by the signal processing circuit 43 and then outputted from the output circuit 44 to an outside of the imaging device 100.

The current source circuit 50, the RAMP comparator 54, and the AD conversion circuit 40 are provided for each column. The current source circuit 50, the RAMP comparator 54, and the AD conversion circuit 40 are controlled by the control circuit 42.

The following describes, with reference to FIG. 5, what signal paths the signals of the pixels of the pixel array 1 follow from the pixels. In the following, one of the plurality of pixels is sometimes referred to as "first pixel 2". One of the plurality of pixels is sometimes referred to as "second pixel 3". A path through which a signal of the first pixel 2 flows is sometimes referred to as "first signal path 4". A path through which a signal of the second pixel 3 flows is sometimes referred to as "second signal path 5".

In a first example, the first pixel 2 is a first type of pixel selected from among four types of pixel consisting of an R pixel, a B pixel, a Gr pixel, and a Gb pixel. The second pixel 3 is a second type of pixel selected from among four types of pixel consisting of an R pixel, a B pixel, a Gr pixel, and a Gb pixel. The first type of pixel and the second type of pixel are different from each other.

In a second example, the first pixel 2 is a pixel of a first color. The second pixel 3 is a pixel of a second color. The first color and the second color are different from each other. Specifically, for example, the first pixel 2 includes a color filter of the first color. The second pixel 3 includes a color filter of the second color. In the first example, too, the first pixel 2 and the second pixel 3 may be different in color from each other.

In the example shown in FIG. 5, the first circuit 6 includes a first voltage line 7 and a second voltage line 8. To the first voltage line 7, a first voltage is applied. To the second voltage line 8, a second voltage is applied. The first voltage and the second voltage are different from each other.

In the following, the term "first wiring part J1" is sometimes used. The first wiring part J1 is a wiring part to which the first voltage is applied. The first wiring part J1 may correspond to one first voltage line 7 or a plurality of first voltage lines 7. In the example shown in FIG. 6 to be described below, the first wiring part J1 corresponds to one first voltage line 7.

In the following, the term "second wiring part J2" is sometimes used. The second wiring part J2 is a wiring part to which the second voltage is applied. The second wiring part J2 may correspond to one second voltage line 8 or a plurality of second voltage lines 8. In the example shown in FIG. 6 to be described below, the second wiring part J2 corresponds to one second voltage line 8.

In the first embodiment, the first voltage is a power supply voltage. The second voltage is a ground voltage. The first voltage line 7 and the second voltage line 8 are utilized to actuate an element of the first circuit 6. In one example, the first voltage line 7 and the second voltage line 8 are utilized as charge-exchange paths for actuating an element of the first circuit 6. For example, the voltage lines 7 and 8 are used in the buffer circuit of the pre-stage circuit 53 of FIG. 4. Alternatively, the second voltage may be a power supply voltage, and the first voltage may be a ground voltage.

Figure 6:
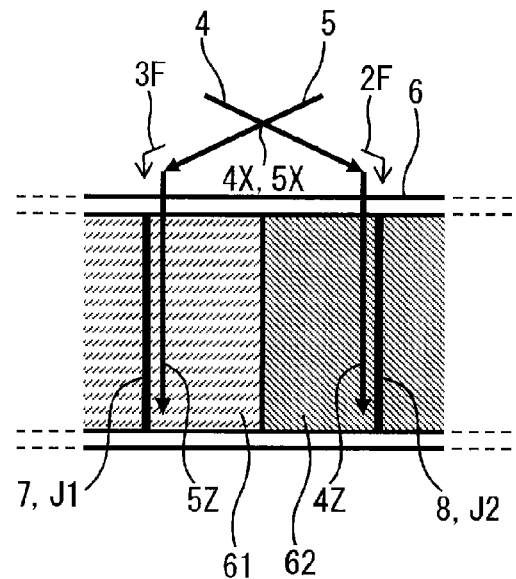
FIG. 6 is an explanatory diagram of signal paths according to the first embodiment.

Note here that, as shown in FIG. 6, in a plan view, a region closer to the first wiring part J1 than the second wiring part J2 is defined as a first region 61. In the plan view, a region closer to the second wiring part J2 than the first wiring part J1 is defined as a second region 62. Then, in the plan view, a first crossing portion 4X of the first signal path 4 where the first signal path 4 crosses the second signal path 5 and a first extension portion 4Z of the first signal path 4 that extends within the second region 62 are arranged in this order along a direction of flow 2F of the signal of the first pixel 2. That is, in the flow of the signal of the first pixel 2, the first crossing portion 4X is located upstream of the first extension portion 4Z. In the plan view, a second crossing portion 5X of the second signal path 5 where the second signal path 5 crosses the first signal path 4 and a second extension portion 5Z of the second signal path 5 that extends within the first region 61 are arranged in this order along a direction of flow 3F of the signal of the second pixel 3. That is, in the flow of the signal of the second pixel 3, the second crossing portion 5X is located upstream of the second extension portion 5Z. As described earlier, the first wiring part J1 is a wiring part to which the first voltage is applied. The second wiring part J2 is a wiring part to which the second voltage is applied. In the example shown in FIG. 6, the first wiring part J1 corresponds to one first voltage line 7. The second wiring part J2 corresponds to one second voltage line 8. This can be useful in noise reduction in the presence of a plurality of voltage lines 7 and 8 to which different voltages are applied.

Figure 7:
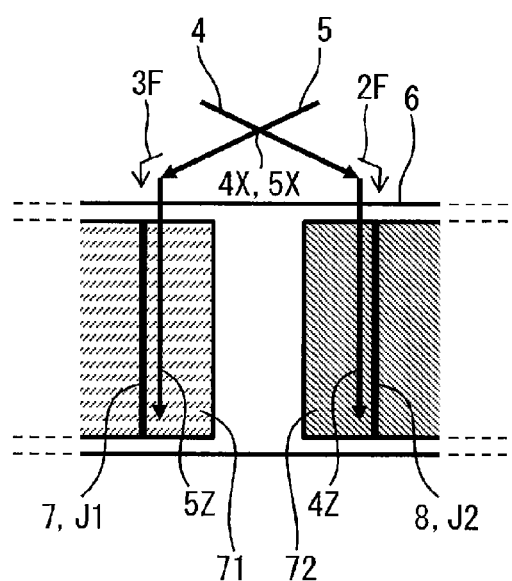
FIG. 7 is an explanatory diagram of signal paths according to the first embodiment.

Specifically, for example, as shown in FIG. 7, in the plan view, a region where the ratio of the distance from the first wiring part J1 to the distance from the second wiring part J2 is ½ or lower is defined as a first ½ region 71. In the plan view, a region where the ratio of the distance from the second wiring part J2 to the distance from the first wiring part J1 is ½ or lower is defined as a second ½ region 72. The first extension portion 4Z is a portion of the first signal path 4 that extends within the second ½ region 72 in the plan view. The second extension portion 5Z is a portion of the second signal path 5 that extends within the first ½ region 71 in the plan view. In this specific example, "½" may be replaced by "⅓" or may be replaced by "¼". The same applies to the embodiments to be described below.

Typically, the pixel array 1 is provided on the semiconductor substrate. The term "plan view" refers, for example, to an observation made parallel to a thickness direction of the semiconductor substrate. FIGS. 5 to 7 show arrangements based on the plan view.

The following describes examples of advantages that are brought by the configuration in the plan view.

For example, there is a case where there are restrictions on the order of arrangement of the first voltage line 7 and the second voltage line 8 in the plan view. Such restrictions may be imposed in a case where the first voltage line 7 and the second voltage line 8 are shared by the first circuit 6 and a different circuit. Further, there is a case where the imaging device 100 is an image sensor chip such as that shown in FIG. 2 and the chip has external pads 90 via which the first voltage is supplied to the first voltage line 7 and the second voltage is supplied to the second voltage line 8. In such a case, the aforementioned restrictions may be imposed by the order of arrangement of the external pads 90.

Suppose that the aforementioned restrictions apply. Suppose that in the second circuit 14 as seen in the plan view, the first signal path 4 needs to extend through a place relatively closer to the first voltage line 7 (in the example shown in FIG. 5, a left-side place) and the second signal path 5 needs to extend through a place closer to the second voltage line 8 (in the example shown in FIG. 5, a right-side place). Furthermore, suppose that the first voltage line 7 generates a smaller noise component than the second voltage line 8 does. In such a case, the aforementioned crossing contributes to making the first signal path 4 and the second signal path 5 closer to the second voltage line 8 and the first voltage line 7, respectively, in the plan view. The aforementioned crossing contributes to making noise that is superimposed in the first circuit 6 onto a signal flowing through the first signal path 4 smaller than noise that is superimposed in the first circuit 6 onto a signal flowing through the second signal path 5.

The technique that can make noise that is superimposed in the first circuit 6 onto a signal flowing through the first signal path 4 smaller than noise that is superimposed in the first circuit 6 onto a signal flowing through the second signal path 5 can be useful in various situations. This can be useful, for example, in a case where noise that is superimposed onto the signal of the first pixel 2 needs to be made smaller than noise that is superimposed onto the signal of the second pixel 3. Further, suppose that the imaging device 100 has drive modes including a normal mode and a pixel addition mode. The control circuit 42 and the row scanning circuit 41 control the drive modes. Note here that the normal mode is a mode in which the signal of the first pixel 2 flows through the first signal path 4 and the signal of the second pixel 3 flows through the second signal path 5. The pixel addition mode is a mode in which the signal of the first pixel 2 and the signal of the second pixel 3 are mixed in the pixel array 1 and the resulting mixed signal flows through the first signal path 4. The aforementioned technique can reduce noise that is superimposed in the first circuit 6 onto the mixed signal in the pixel addition mode.

The pixel array 1 and the electric circuit 47 as illustrated are merely examples. There are no particular limitations on how the pixel array 1 and the electric circuit 47 are configured. It is not essential that all of the second circuit 14, the first circuit 6, the AD conversion circuit 40, the signal processing circuit 43, the output circuit 44, the row scanning circuit 41, and the control circuit 42 be present. For example, the second circuit 14 may be omitted. The same applies to the embodiments to be described below.

The first circuit 6 and/or the second circuit 14 may be an analog circuit(s) such as a current source circuit(s). The first circuit 6 and/or the second circuit 14 may be a digital circuit(s) that operate(s) on a clock(s).

Figure 8:
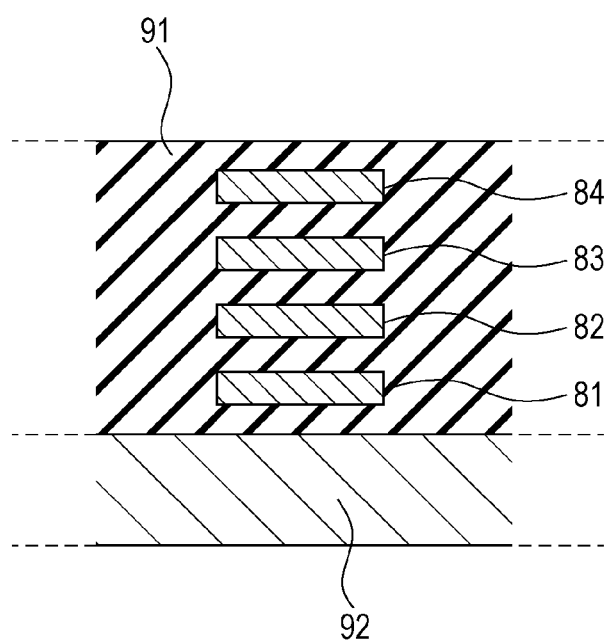
FIG. 8 is a cross-sectional view of the imaging device according to the first embodiment.

FIG. 8 is a cross-sectional view of the imaging device 100 as taken along a thickness direction according to an example. As shown in FIG. 8, the imaging device 100 includes an insulating layer 91. In this example, the insulating layer 91 is provided on a semiconductor substrate 92. A plurality of wiring layers are provided at different depth positions in the insulating layer 91. In the example shown in FIG. 8, the plurality of wiring layers include a first wiring layer 81, a second wiring layer 82, a third wiring layer 83, and a fourth wiring layer 84. One or all of the first signal path 4, the second signal path 5, the first voltage line 7, and the second voltage line 8 may be provided in the same wiring layer. One or all of them may be provided in different wiring layers.

In the first embodiment, the imaging device 100 includes two wiring layers that are different layers in a multi-layer wiring layer. A first one of the two wiring layers includes the first crossing portion 4X. A second one of the two wiring layers includes the second crossing portion 5X. This makes it easy to achieve the crossing of the first signal path 4 and the second signal path 5 in the plan view. The first one of the two wiring layers may be any of the wiring layers 81 to 84 of FIG. 8. The second one of the two wiring layers may be any of the wiring layers 81 to 84 of FIG. 8.

Figure 9:
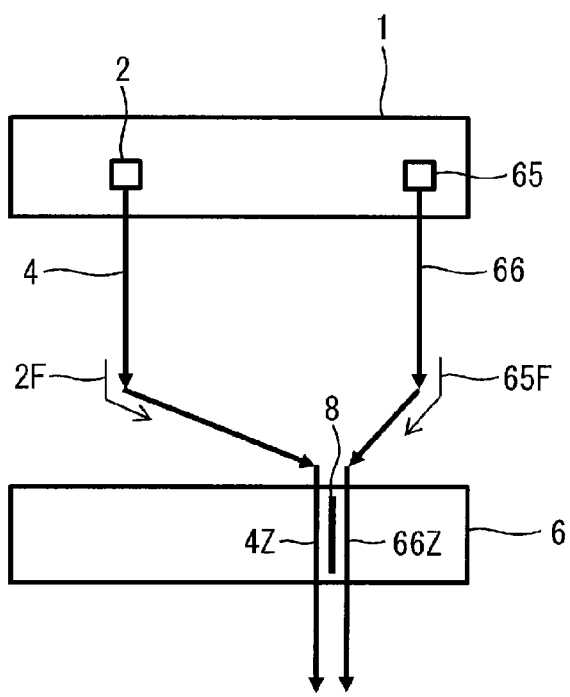
FIG. 9 is an explanatory diagram of signal paths according to the first embodiment.

In the example shown in FIG. 9, the plurality of pixels include a first OB pixel 65, which is an optical black pixel. The imaging device 100 includes a signal processing circuit 43 and a first OB path 66 through which a signal of the first OB pixel 65 flows. In the plan view, the first OB path 66 has a first OB extension portion 66Z that extends within the second region 62. The signal processing circuit 43 performs an optical black correction on the signal of the first pixel 2, which has passed through the first extension portion 4Z, with use of the signal of the first OB pixel 65, which has passed through the first OB extension portion 66Z. This is suitable to reducing a noise component superimposed on the signal of the first pixel 2 in the second region 62. Although not shown in FIG. 9, the AD conversion circuit 40 may be situated between the signal processing circuit 43 and the first circuit 6.

Specifically, for example, the first OB extension portion 66Z is a portion of the first OB path 66 that extends within the second ½ region 72 in the plan view. The first extension portion 4Z is a portion of the first signal path 4 that extends within the second ½ region 72 in the plan view.

Figure 10:
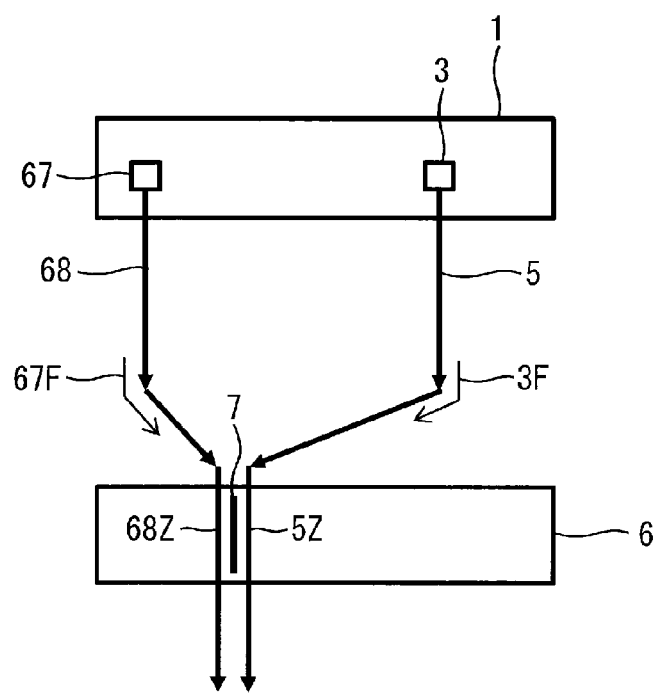
FIG. 10 is an explanatory diagram of signal paths according to the first embodiment.

In the example shown in FIG. 10, the plurality of pixels include a second OB pixel 67, which is an optical black pixel. The imaging device 100 includes a signal processing circuit 43 and a second OB path 68 through which a signal of the second OB pixel 67 flows. In the plan view, the second OB path 68 has a second OB extension portion 68Z that extends within the first region 61. The signal processing circuit 43 performs an optical black correction on the signal of the second pixel 3, which has passed through the second extension portion 5Z, with use of the signal of the second OB pixel 67, which has passed through the second OB extension portion 68Z. This is suitable to reducing a noise component superimposed on the signal of the second pixel 3 in the first region 61.

Specifically, for example, the second OB extension portion 68Z is a portion of the second OB path 68 that extends within the first ½ region 71 in the plan view. The second extension portion 5Z is a portion of the second signal path 5 that extends within the first ½ region 71 in the plan view.

In the first embodiment, the plurality of pixels constitute the pixel array 1, which has at least one row and a plurality of columns. The first pixel 2 of the pixel array 1 and the second pixel 3 of the pixel array 1 belong to columns adjacent to each other.

The first embodiment is configured such that in the plan view, the first wiring part J1, the second wiring part J2, the first extension portion 4Z, and the second extension portion 5Z extend parallel to one another. Note here that in the example shown in FIG. 6, as mentioned earlier, the first wiring part J1 corresponds to one first voltage line 7. The second wiring part J2 corresponds to one second voltage line 8. Such a parallel layout is advantageous in terms of miniaturization. Meanwhile, this parallel layout is not necessarily advantageous in terms of noise reduction. For this reason, in the parallel layout, the aforementioned noise reduction easily exerts its effects.

The first embodiment is configured such that in the plan view, the first wiring part J1, the second wiring part J2, the first extension portion 4Z, and the second extension portion 5Z extend straight.

The first voltage at the first voltage line 7 may be a fixed voltage or may be a time-variable voltage. The same applies to the second voltage at the second voltage line 8. Examples of the fixed voltage include a voltage of a mode signal and a voltage of a register signal. Examples of the time-variable voltages that correspond to the first voltage and the second voltage include AC voltages of different frequencies. Examples of such AC voltages include voltages of clock signals. Either one of the first and second voltages may be a voltage of a clock signal, and the other one of the first and second voltages may be a voltage of a data signal. The first voltage and the second voltage may be voltages of pulse signals of different timings and/or different duty ratios.

In the plan view, the aforementioned crossing may be made in a region between the first circuit 6 and the second circuit 14, may be made in a region on the first circuit 6, or may be made in a region on the second circuit 14. It should be noted that an element-separating region that electrically separates the first circuit 6 and the second circuit 14 from each other may be provided between the first circuit 6 and the second circuit 14. In the plan view, the aforementioned crossing may be made in a position that overlaps the element-separating region.

In the first embodiment, the first crossing portion 4X is a portion through which the analog signal of the first pixel 2 passes. The second crossing portion 5X is a portion through which the analog signal of the second pixel 3 passes. Further, in the first embodiment, the first extension portion 4Z is a portion through which the analog signal of the first pixel 2 passes. The second extension portion 5Z is a portion through which the analog signal of the second pixel 3 passes. Similarly, the first OB extension portion 66Z and the second OB extension portion 68Z are portions through which the corresponding analog signals pass. Similarly, a third extension portion 11Z, a third extension portion 4BZ, a fourth extension portion 5Z, and a fourth extension portion 5BZ, which will be described later, are portions through which corresponding analog signals pass.

The crossing at the crossing portions 4X and 5X may be the only crossing of the first signal path 4 and the second signal path 5 in the plan view. In the plan view, a further crossing of the first signal path 4 and the second signal path 5 may be made at a portion other than the portions 4X and 5X. For example, in the plan view, a further crossing may be made downstream from the first circuit 6. In the plan view, a further crossing may be made outside the imaging device 100 downstream of the output circuit 44. The term "downstream" here refers to downstream of the direction of flow 2F of the signal of the pixel 2 and the direction of flow 3F of the signal of the pixel 3.

The second circuit 14 may include a plurality of voltage lines. Specifically, in the example shown in FIG. 11, the plurality of voltage lines include one third voltage line 15 and two fourth voltage lines 16 (which are examples of the fourth and fifth voltage lines of the present disclosure) adjacent to the third voltage line 15. Either one of the fourth voltage lines 16, the third voltage line 15, and the other one of the fourth voltage lines 16 are arranged in this order in the plan view. This example is configured such that in the plan view, the pitch between the voltage line 15 and each of the voltage lines 16 in the second circuit 14 and the pitch between the voltage lines 7 and 8 in the first circuit 6 are different from each other. The term "pitch between voltage lines" refers to the spacing between a center line that extends in a longitudinal direction of a voltage line and a center line that extends in a longitudinal direction of a voltage line adjacent to the voltage line.

In one specific example, a third voltage is applied to the third voltage line 15. A fourth voltage is applied to the fourth voltage lines 16. The third voltage and the fourth voltage are different from each other.

The third voltage may be equal to either one of the first and second voltages. The fourth voltage may be equal to the other one of the first and second voltages. The third voltage may be different from both the first voltage and the second voltage. The fourth voltage may be different from both the first voltage and the second voltage.

In the first embodiment, the third voltage of the third voltage line 15 is a power supply voltage. The fourth voltage of the fourth voltage lines 16 is a ground voltage. The third voltage line 15 and the fourth voltage lines 16 are utilized to actuate an element of the second circuit 14. The voltage lines 15 and 16 are used, for example, in the current source circuit 50 of FIG. 4. Alternatively, the fourth voltage may be a power supply voltage, and the third voltage may be a ground voltage. The voltage line 15 and the voltage lines 16 are connected, for example, to transistors inside the current source circuit 50 to supply voltages to the transistors.

The third voltage may be a fixed voltage or may be a time-variable voltage. The same applies to the fourth voltage. Examples of the fixed voltage include a voltage of a mode signal and a voltage of a register signal. Examples of the time-variable voltages that correspond to the third voltage and the fourth voltage include AC voltages of different frequencies. Examples of such AC voltages include voltages of clock signals. Either one of the third and fourth voltages may be a voltage of a clock signal, and the other one of the third and fourth voltages may be a voltage of a data signal. The third voltage and the fourth voltage may be voltages of pulse signals of different timings and/or different duty ratios.

In the following, the term "third wiring part J3" is sometimes used. The third wiring part J3 is a wiring part to which the third voltage is applied. The third wiring part J3 may correspond to one third voltage line 15 or a plurality of third voltage lines 15. In the example shown in FIG. 11, the third wiring part J3 corresponds to one third voltage line 15.

In the following, the term "fourth wiring part J4" is sometimes used. The fourth wiring part J4 is a wiring part to which the fourth voltage is applied. The fourth wiring part J4 may correspond to one fourth voltage line 16 or a plurality of fourth voltage lines 16. In the example shown in FIG. 11, the fourth wiring part J4 corresponds to two fourth voltage lines 16.

Figure 11:
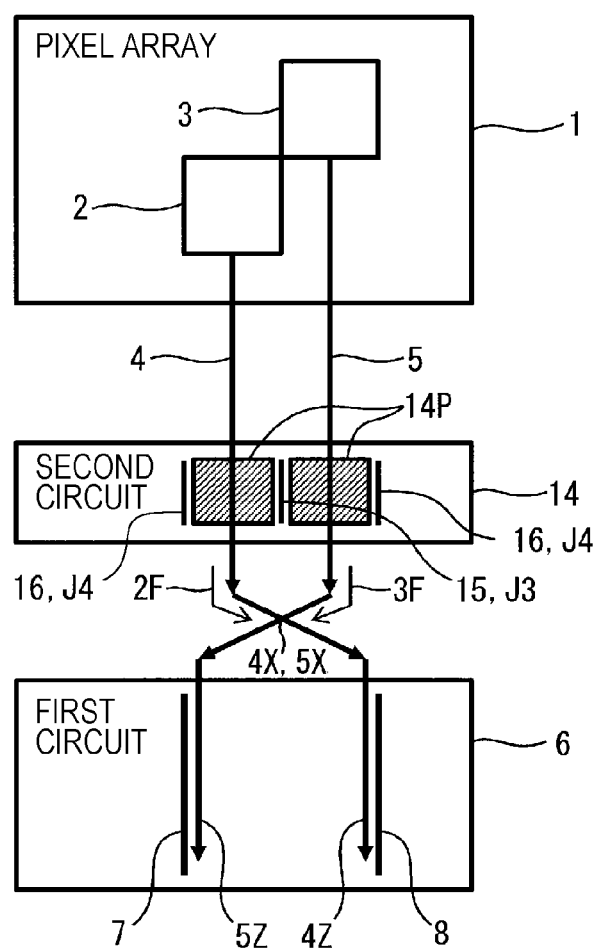
FIG. 11 is an explanatory diagram of signal paths according to the first embodiment.

In the example shown in FIG. 11, the imaging device 100 includes a second circuit 14 including a third wiring part J3 and a fourth wiring part J4. In the plan view, the pitch between the first wiring part J1 and the second wiring part J2 and the pitch between the third wiring part J3 and the fourth wiring part J4 are different from each other. In the plan view, a region between the third wiring part J3 and the fourth wiring part J4 is defined as a pitch region 14P. Then, in the plan view, a portion of the first signal path 4 that extends within the pitch region 14P, the first crossing portion 4X, and the first extension portion 4Z are arranged in this order along the direction of flow 2F of the signal of the first pixel 2. In the plan view, a portion of the second signal path 5 that extends within the pitch region 14P, the second crossing portion 5X, and the second extension portion 5Z are arranged in this order along the direction of flow 3F of the signal of the second pixel 3. In this example, the first wiring part J1 corresponds to one first voltage line 7. The second wiring part J2 corresponds to one second voltage line 8. The third wiring part J3 corresponds to one third voltage line 15. The fourth wiring part J4 corresponds to two fourth voltage lines 16. A case where there is such a difference in pitch is an example of a case where a layout accompanied by the aforementioned crossing can contribute to noise reduction. Specifically, for example, in a case where the first circuit 6 and the second circuit 14 differ in pitch from each other, a possibility that the signal paths 4 and 5 cannot come into proximity to the desired voltage lines by extending straight in the plan view is higher than in a case where the pitches are equal. However, the aforementioned crossing makes proximity to the desired voltage lines easy.

Specifically, in the example shown in FIG. 11, the pitch between the first wiring part J1 and the second wiring part J2 is equal to the pitch between the first voltage line 7 and the second voltage line 8. The pitch between the third wiring part J3 and the fourth wiring part J4 is equal to the pitch between the third voltage line 15 and each of the fourth voltage lines 16. The pitch region 14P is a region between the third voltage line 15 and each of the fourth voltage lines 16.

As mentioned above, the example shown in FIG. 11 is configured such that in the plan view, the pitch between the voltage line 15 and each of the voltage lines 16 in the second circuit 14 and the pitch between the voltage lines 7 and 8 in the first circuit 6 are different from each other. Specifically, for example, the pitch between the voltage line 15 and each of the voltage lines 16 in the second circuit 14 is equal to the pitch between columns of pixels (such a pitch being hereinafter sometimes referred to as "one-column pitch"). The pitch between the voltage lines 7 and 8 in the first circuit 6 is different from a one-column pitch. The voltage lines 7 and 8 have a pitch twice as wide as the pitch between columns of pixels (such a pitch being hereinafter sometimes referred to as "two-column pitch").

Figure 12:
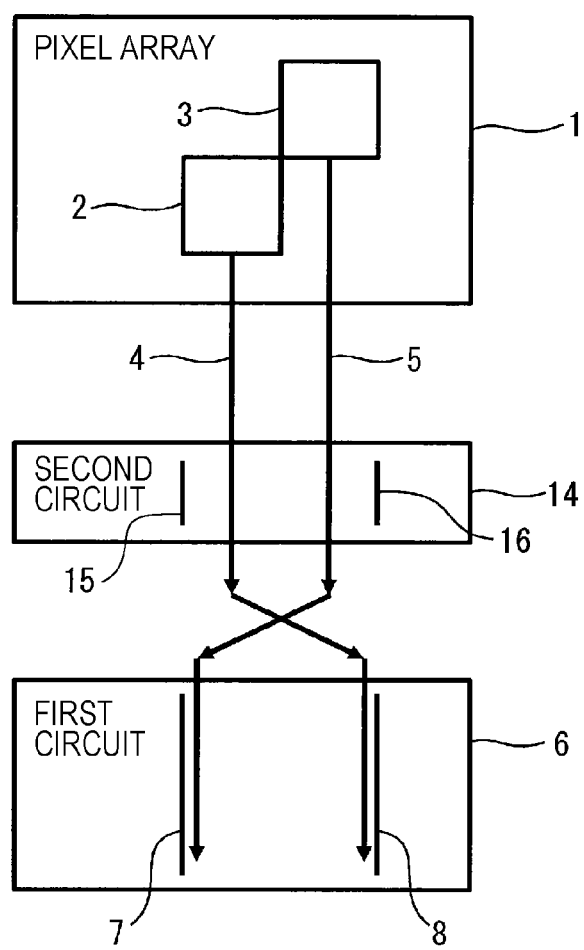
FIG. 12 is an explanatory diagram of signal paths according to the first embodiment.

As shown in FIG. 12, in the plan view, the pitch between a plurality of voltage lines 15 and 16 in the second circuit 14 and the pitch between the voltage lines 7 and 8 in the first circuit 6 may be equal to each other.

The signals of the pixels may be inputted to the first circuit 6 via the signal paths. The signals of the pixels do not need to be inputted to the first circuit 6.

The signals of the pixels may be inputted to the second circuit 14 via the signal paths. The signals of the pixels do not need to be inputted to the second circuit 14.

Second Embodiment

The following describes a second embodiment. In the second embodiment, contents which are identical to those of the first embodiment are given the same signs and are not described.

Figure 13:
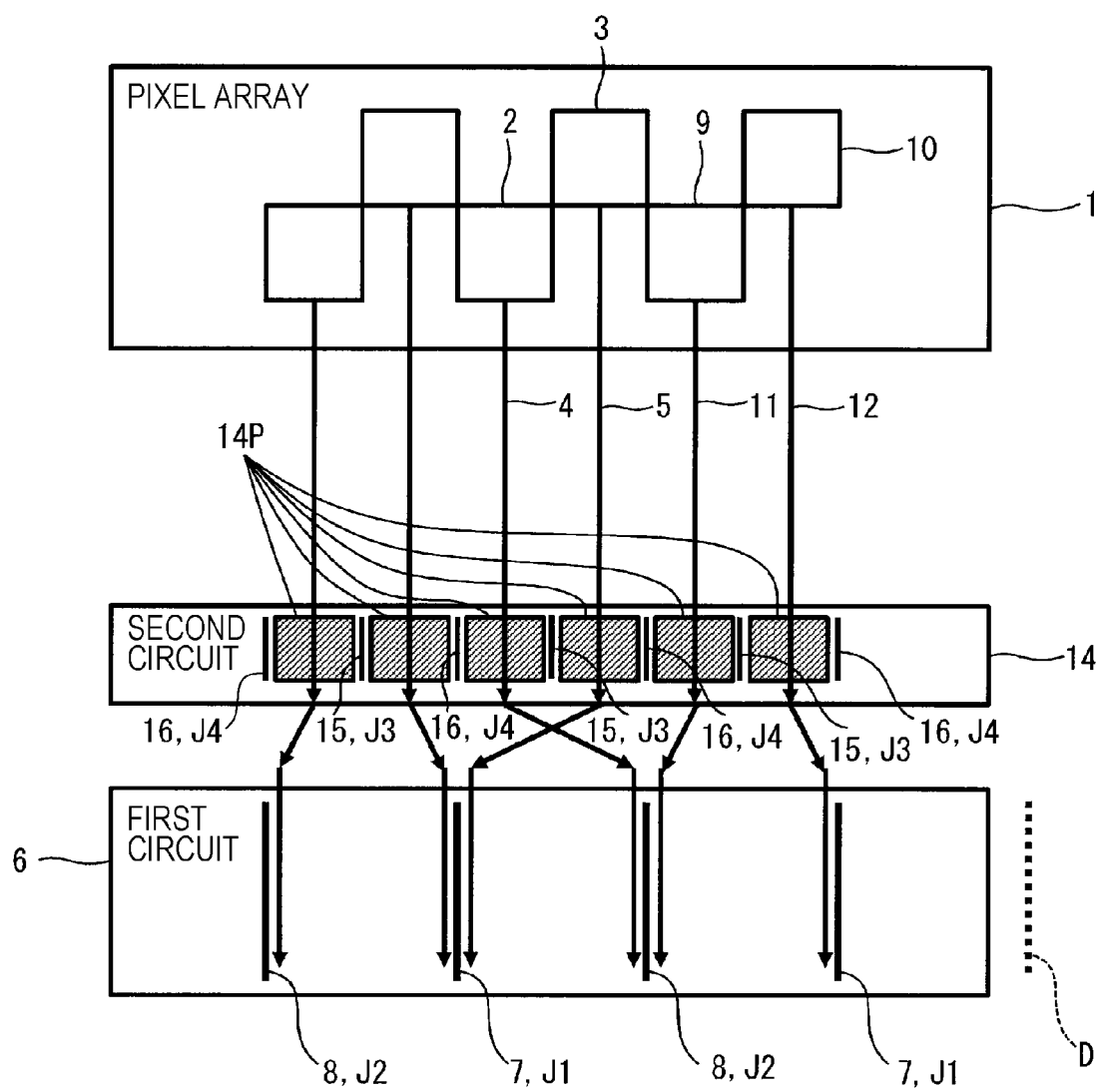
FIG. 13 is an explanatory diagram of signal paths according to a second embodiment.

FIG. 13 shows a pixel array 1, a second circuit 14, and a first circuit 6 according to the second embodiment.

In the example shown in FIG. 13, the pixel array 1 includes a plurality of pixels. One of the plurality of pixels is sometimes referred to as "third pixel 9". One of the plurality of pixels is sometimes referred to as "fourth pixel 10". A path through which a signal of the third pixel 9 flows is sometimes referred to as "third signal path 11". A path through which a signal of the fourth pixel 10 flows is sometimes referred to as "fourth signal path 12".

In the example shown in FIG. 13, the first circuit 6 includes a plurality of first voltage lines 7 and a plurality of second voltage lines 8. The first voltage lines 7 and the second voltage lines 8 are alternately and repeatedly arranged in the plan view.

Figure 14:
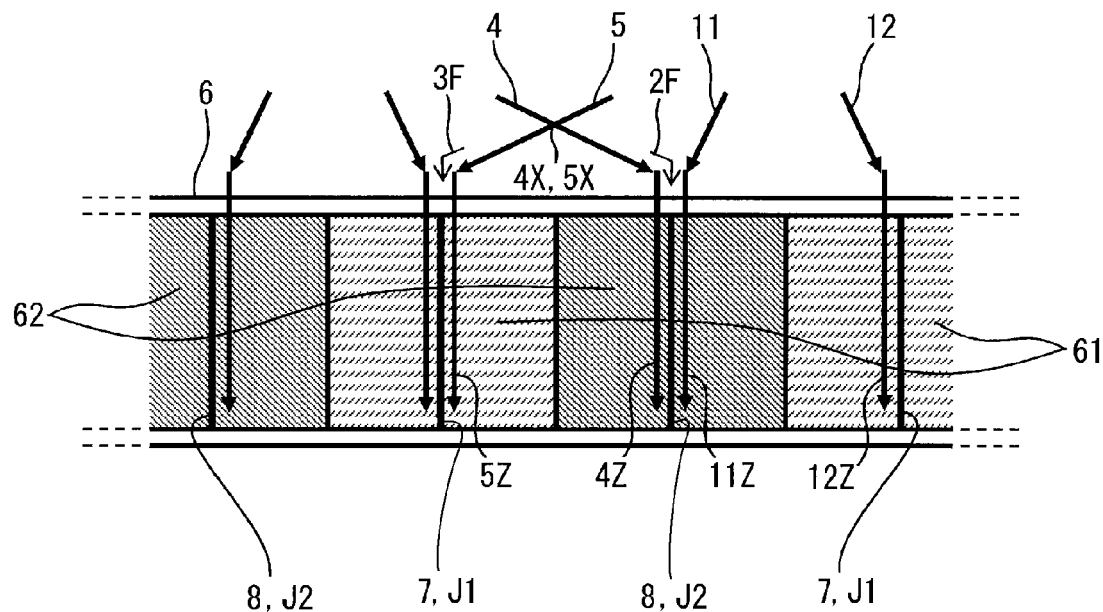
FIG. 14 is an explanatory diagram of signal paths according to the second embodiment.

In the example shown in FIG. 13, the number of first voltage lines 7 is more than one, and the number of second voltage lines 8 is more than one. FIG. 14 shows a first region 61 and a second region 62 in this case. In the plan view, a first crossing portion 4X of the first signal path 4 where the first signal path 4 crosses the second signal path 5 and a first extension portion 4Z of the first signal path 4 that extends within the second region 62 are arranged in this order along a direction of flow 2F of the signal of the first pixel 2. In the plan view, a second crossing portion 5X of the second signal path 5 where the second signal path 5 crosses the first signal path 4 and a second extension portion 5Z of the second signal path 5 that extends within the first region 61 are arranged in this order along a direction of flow 3F of the signal of the second pixel 3. Note here that the first wiring part J1 is a wiring part to which the first voltage is applied. The second wiring part J2 is a wiring part to which the second voltage is applied. In the example shown in FIG. 13, the first wiring part J1 corresponds to a plurality of first voltage lines 7. The second wiring part J2 corresponds to a plurality of second voltage lines 8.

Figure 15:
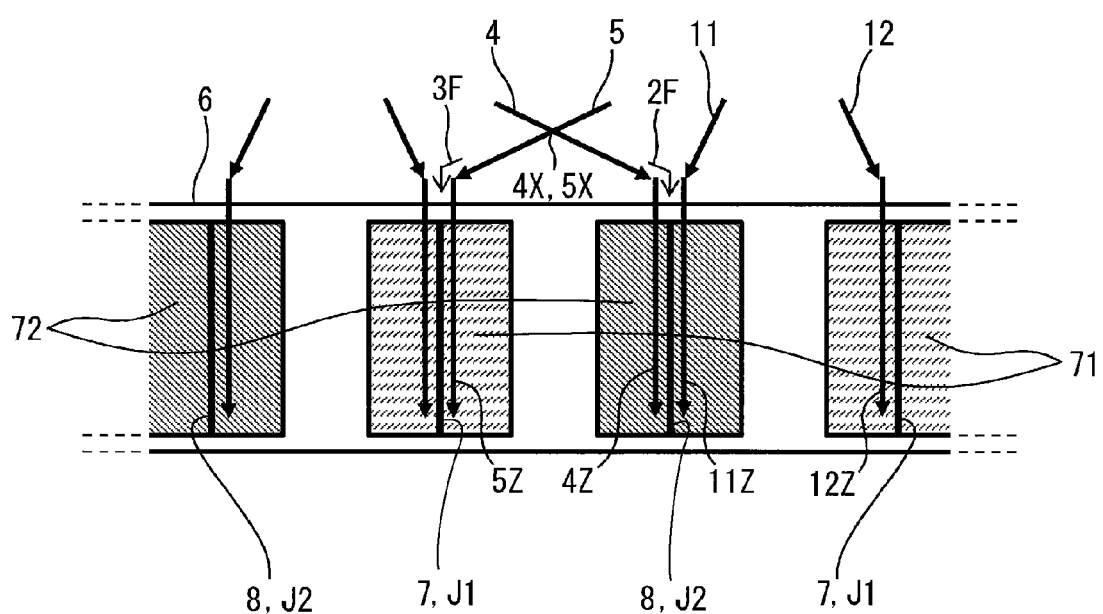
FIG. 15 is an explanatory diagram of signal paths according to the second embodiment.

Specifically, for example, as shown in FIG. 15, the first extension portion 4Z is a portion of the first signal path 4 that extends within the second ½ region 72 in the plan view. The second extension portion 5Z is a portion of the second signal path 5 that extends within the first ½ region 71 in the plan view.

In the example shown in FIG. 13, the plurality of voltage lines of the second circuit 14 include a plurality of third voltage lines 15 and a plurality of fourth voltage lines 16. The third voltage lines 15 and the fourth voltage lines 16 are alternately and repeatedly arranged in the plan view. This example is configured such that in the plan view, the pitch between a plurality of voltage lines 15 and 16 in the second circuit 14 and the pitch between voltage lines 7 and 8 in the first circuit 6 are different from each other.

In the example shown in FIG. 13, the plurality of voltage lines 15 and 16 of the second circuit 14 have one-column pitches. The voltage lines 7 and 8 of the first circuit 6 have pitches different from one-column pitches. Specifically, for example, the voltage lines 7 and 8 have two-column pitches.

In the example shown in FIG. 13, the imaging device 100 includes a second circuit 14 including a third wiring part J3 and a fourth wiring part J4. In the plan view, the pitch between the first wiring part J1 and the second wiring part J2 and the pitch between the third wiring part J3 and the fourth wiring part J4 are different from each other. In the plan view, a region between the third wiring part J3 and the fourth wiring part J4 is defined as a pitch region 14P. Then, in the plan view, a portion of the first signal path 4 that extends within the pitch region 14P (which is an example of the first pitch portion of the present disclosure), the first crossing portion 4X, and the first extension portion 4Z are arranged in this order along the direction of flow 2F of the signal of the first pixel 2. In the plan view, a portion of the second signal path 5 that extends within the pitch region 14P (which is an example of the second pitch portion of the present disclosure), the second crossing portion 5X, and the second extension portion 5Z are arranged in this order along the direction of flow 3F of the signal of the second pixel 3. In the example shown in FIG. 13, the first wiring part J1 corresponds to a plurality of first voltage lines 7. The second wiring part J2 corresponds to a plurality of second voltage lines 8. The third wiring part J3 corresponds to a plurality of third voltage lines 15. The fourth wiring part J4 corresponds to a plurality of fourth voltage lines 16.

Specifically, in the example shown in FIG. 13, the pitch between the first wiring part J1 and the second wiring part J2 is equal to the pitch between a first voltage line 7 and a second voltage line 8. The pitch between the third wiring part J3 and the fourth wiring part J4 is equal to the pitch between a third voltage line 15 and a fourth voltage line 16. The pitch region 14P is a region between a third voltage line 15 and a fourth voltage line 16.

Figure 16:
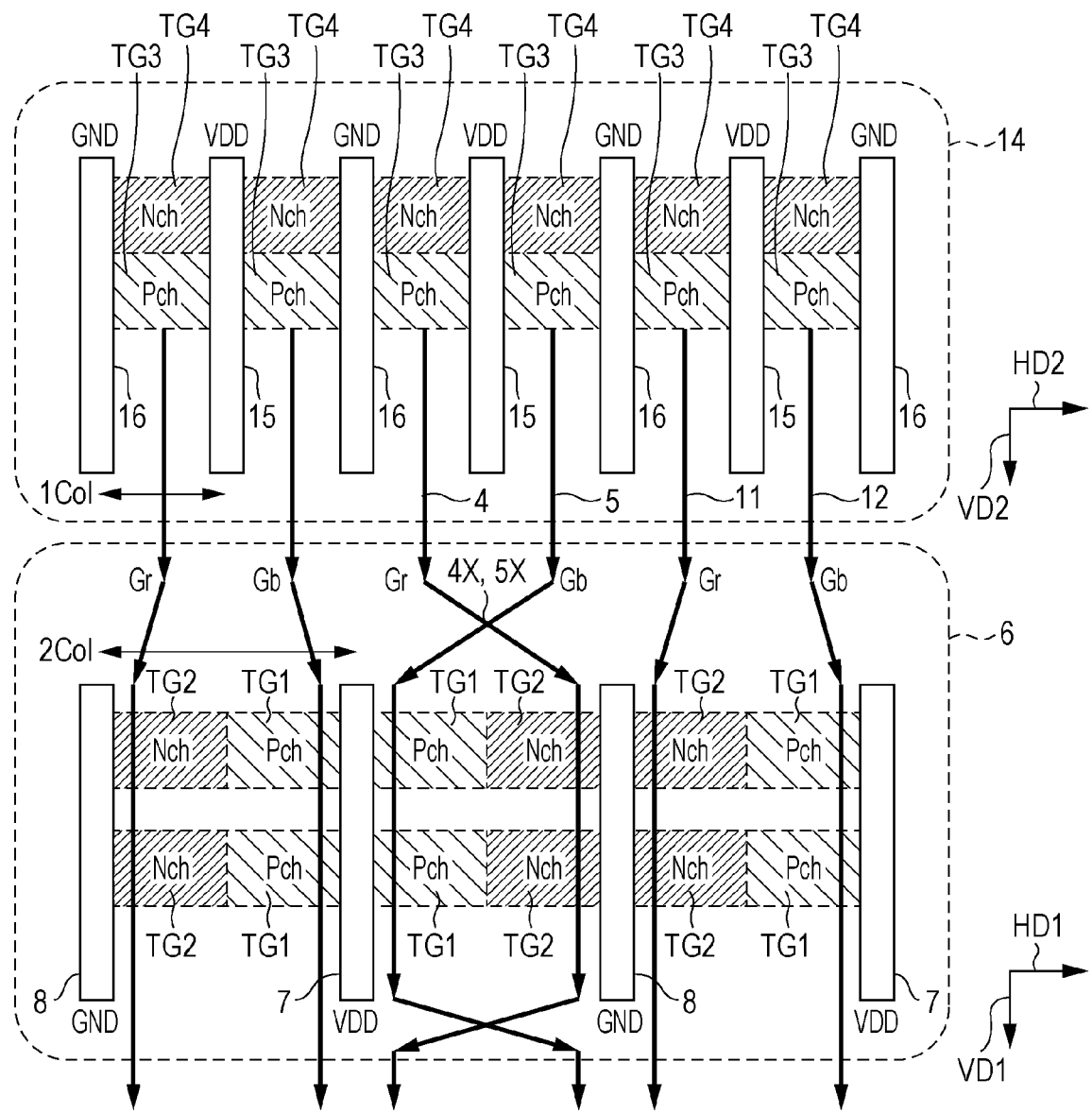
FIG. 16 is an explanatory diagram of signal paths according to the second embodiment.

FIG. 16 shows detailed examples of the second circuit 14 and the first circuit 6. Specifically, FIG. 16 shows the second circuit 14 and the first circuit 6 in the plan view. FIG. 16 partially omits to illustrate the signal paths. The same applies to FIGS. 19A and 19B, which will be described later.

In FIG. 16, unlike in FIG. 13, in the plan view, the first signal path 4 and the second signal path 5 cross each other in a region on the first circuit 6. As mentioned above, in the plan view, this crossing may be made in a region between the first circuit 6 and the second circuit 14, may be made in a region on the first circuit 6, or may be made in a region on the second circuit 14. Alternatively, in the plan view, this crossing may be made in a position that overlaps an element-separating region.

In the plan view, a pitch direction in which the voltage lines 7 and 8 of the first circuit 6 are arranged is defined as a first horizontal direction HD1, and a direction orthogonal to the first horizontal direction HD1 is defined as a first vertical direction VD1. In the plan view, the first circuit 6 has first and second transistors TG1 and TG2 arranged along the first horizontal direction HD1 between adjacent voltage lines 7 and 8.

In the example shown in FIG. 16, the first transistor TG1 is a transistor of a first conductivity type. The second transistor TG2 is a transistor of a second conductivity type. The first conductivity type and the second conductivity type are different from each other. In the example shown in FIG.

16, specifically, the first conductivity type is a p-type. The second conductivity type is an n-type. More specifically, for example, the first transistor TG1 is a P-channel FET, and the second transistor TG2 is an N-channel FET. Alternatively, the first transistor TG1 may be an N-channel FET, and the second transistor TG2 may be a P-channel FETs. In this case, the voltage lines 7 and the voltage lines 8 are arranged in the opposite order to the one in which they are arranged in FIG. 16.

The first transistor TG1 is connected to the first voltage lines 7. The second transistor TG2 is connected to the second voltage lines 8.

In the plan view, a pitch direction in which the voltage lines 15 and 16 of the second circuit 14 are arranged is defined as a second horizontal direction HD2, and a direction orthogonal to the second horizontal direction HD2 is defined as a second vertical direction VD2. In the plan view, the second circuit 14 has third and fourth transistors TG3 and TG4 arranged along the second vertical direction VD2 between adjacent voltage lines 15 and 16.

In the example shown in FIG. 16, the third transistor TG3 is a transistor of the first conductivity type. The fourth transistor TG4 is a transistor of the second conductivity type. Specifically, for example, the third transistor TG3 is a P-channel FET, and the fourth transistor TG4 is an N-channel FET. Alternatively, the third transistor TG3 may be an N-channel FET, and the fourth transistor TG4 may be a P-channel FET.

The third transistor TG3 is connected to the third voltage lines 15. The fourth transistor TG4 is connected to the fourth voltage lines 16.

In the example shown in FIG. 16, signals of the pixels are outputted at column pitches from the second circuit 14.

As just described, in the example shown in FIG. 16, the imaging device 100 includes a second circuit 14. The first circuit 6 includes a first transistor TG1 of a first conductivity type and a second transistor TG2 of a second conductivity type that is different from the first conductivity type. The second circuit 14 includes a third transistor TG3 of the first conductivity type and a fourth transistor TG4 of the second conductivity type. The center of gravity of the gate of the first transistor TG1 and the gate of the second transistor TG2 is defined as a first center of gravity. The center of gravity of the gate of the third transistor TG3 and the gate of the fourth transistor TG4 is defined as a second center of gravity. In the plan view, the direction HD1 of arrangement of the first transistor TG1 and the second transistor TG2 and the direction VD2 of arrangement of the third transistor TG3 and the fourth transistor TG4 are different from each other. Then, in the plan view, a portion of the first signal path 4 that is closest to the second center of gravity and a portion of the first signal path 4 that is closest to the first center of gravity are arranged in this order along the direction of flow 2F of the signal of the first pixel 2. Note here that in the first signal path, the portion that is closest to the second center of gravity may be included in the portion that extends within the pitch region 14P and the portion that is closest to the first center of gravity may be included in the first extension portion 4Z. Further, a portion of the second signal path 5 that is closest to the second center of gravity may be included in the portion of the second signal path 5 that extends within the pitch region 14P and a portion of the second signal path 5 that is closest to the first center of gravity may be included in the second extension portion 5Z.

In the plan view, the portion of the second signal path 5 that is closest to the second center of gravity and the portion of the second signal path 5 that is closest to the first center of gravity are arranged in this order along the direction of flow 3F of the signal of the second pixel 3. This makes it easy to make the first circuit 6 smaller in size in the direction VD1 of arrangement in the plan view, and also makes it easy to make the second circuit 14 smaller in size in the direction HD2 of arrangement in the plan view. For this reason, providing such a difference in arrangement of the transistors makes it easy to alter the shapes of the circuits 6 and 14 in the plan view. This can be effective measures against limitations of space for the circuits to be placed in. Note, however, that the difference in arrangement of the transistors may set a limit on the layout of the first signal path 4 and the second signal path 5 in the first circuit 6 and the second circuit 14. For example, in the presence of a difference in arrangement of the transistors, the aforementioned difference in pitch between voltage lines between the circuits 6 and 14 easily occurs for the sake of application of voltages from the voltage lines to the transistors. For this reason, in the example shown in FIG. 16, a layout accompanied by the aforementioned crossing can contribute to noise reduction.

In one example, the gate of the first transistor TG1 and the gate of the second transistor TG2 are one common electrode. In this case, the "center of gravity of the gate of the first transistor TG1 and the gate of the second transistor TG2" is the center of gravity of this common electrode. In another example, the gate of the first transistor TG1 and the gate of the second transistor TG2 are electrodes that are independent of each other. In this case, the "center of gravity of the gate of the first transistor TG1 and the gate of the second transistor TG2" is the center of gravity of these two electrodes.

In one example, the gate of the third transistor TG3 and the gate of the fourth transistor TG4 are one common electrode. In this case, the "center of gravity of the gate of the third transistor TG3 and the gate of the fourth transistor TG4" is the center of gravity of this common electrode. In another example, the gate of the third transistor TG3 and the gate of the fourth transistor TG4 are electrodes that are independent of each other. In this case, the "center of gravity of the gate of the third transistor TG3 and the gate of the fourth transistor TG4" is the center of gravity of these two electrodes.

As is well known, the center of gravity refers to a point of action of the resultant of forces of gravity acting on each part of an object. A region of spread of at least one electrode that constitutes the gate of the first transistor TG1 and the gate of the second transistor TG2 is measured by a measuring apparatus such as an SEM (scanning electron microscope), and the first center of gravity can be identified from the region thus measured. Similarly, a region of spread of at least one electrode that constitutes the gate of the third transistor TG3 and the gate of the fourth transistor TG4 is measured by a measuring apparatus such as an SEM, and the second center of gravity can be identified from the region thus measured.

In the example shown in FIG. 16, the first circuit 6 includes a first transistor TG1 of a first conductivity type and a second transistor TG2 of a second conductivity type that is different from the first conductivity type. The first voltage lines 7 of the first wiring part J1 are connected to the first transistor TG1. The second voltage lines 8 of the second wiring part J2 are connected to the second transistor TG2. This makes it possible to actuate the first transistor TG1 by utilizing the first voltage of the first wiring part J1, and also makes it possible to actuate the second transistor TG2 by utilizing the second voltage of the second wiring part J2.

The aforementioned transistor-related technique is also applicable to other embodiments such as the first embodiment.

In the example shown in FIG. 13, the plurality of pixels include a third pixel 9. The imaging device 100 includes a third signal path 11 through which a signal of the third pixel 9 flows. As shown in FIG. 14, in the plan view, the third signal path 11 has a third extension portion 11Z that extends within the second region 62. Such a layout makes it easy to make corrections for reducing the noise of the signal of the first pixel 2 and the signal of the third pixel 9. Specifically, for example, such a layout makes it harder for variations in noise components that are superimposed onto the signal of the first pixel 2 and the signal of the third pixel 9 in the first circuit 6 to occur than in a case where either one of the first and third signal paths 4 and 11 extends within the second region 62 and the other one of the first and third signal paths 4 and 11 extends within the first region 61. For this reason, such a layout is suitable to reducing the noise of these signals with corrections under the same correction conditions.

Specifically, for example, as shown in FIG. 15, the third extension portion 11Z is a portion that extends within the second ½ region 72 in the plan view.

In the example shown in FIG. 13, the plurality of pixels include a fourth pixel 10. The imaging device 100 includes a fourth signal path 12 through which a signal of the fourth pixel 10 flows. As shown in FIG. 14, in the plan view, the fourth signal path 12 has a fourth extension portion 12Z that extends within the first region 61. Such a layout makes it easy to make corrections for reducing the noise of the signal of the second pixel 3 and the signal of the fourth pixel 10. Specifically, for example, such a layout makes it harder for variations in noise components that are superimposed onto the signal of the second pixel 3 and the signal of the fourth pixel 10 in the first circuit 6 to occur than in a case where either one of the second and fourth signal paths 5 and 12 extends within the first region 61 and the other one of the second and fourth signal paths 5 and 12 extends within the second region 62. For this reason, such a layout is suitable to reducing the noise of these signals with corrections under the same correction conditions.

Specifically, for example, as shown in FIG. 15, the fourth extension portion 12Z is a portion that extends within the first ½ region 71 in the plan view.

The following describes an example of how to make corrections for reducing noise.

Figure 17:
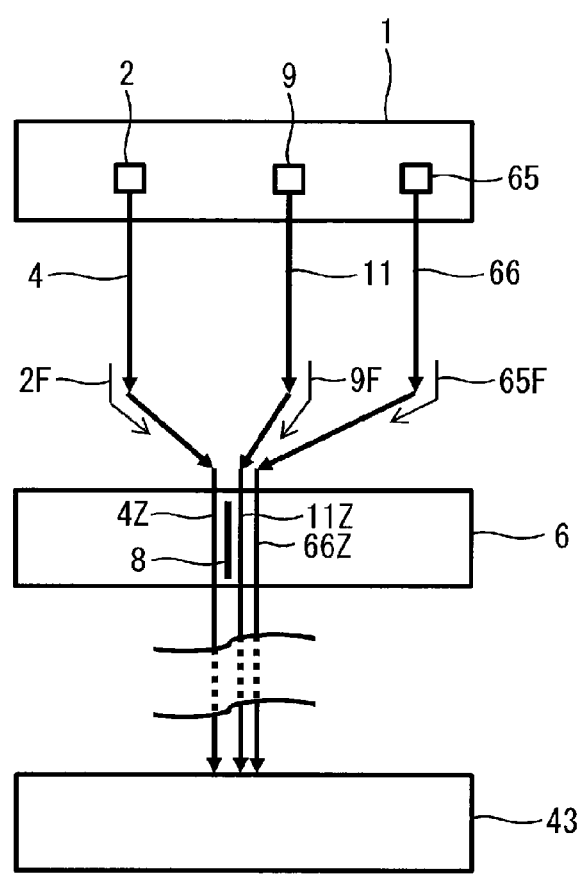
FIG. 17 is an explanatory diagram of signal paths according to the second embodiment.

In the example shown in FIG. 17, the imaging device 100 includes a signal processing circuit 43. The signal processing circuit 43 performs, on both the signal of the first pixel 2, which has passed through the first extension portion 4Z, and the signal of the third pixel 9, which has passed through the third extension portion 11Z, corrections that reduce noise components that are superimposed in the second region 62. This example makes it easy to apply the same correction conditions to the correction to the signal of the first pixel 2 and the correction to the signal of the third pixel 9.

Specifically, for example, the first extension portion 4Z is a portion of the first signal path 4 that extends within the second ½ region 72 in the plan view. The third extension portion 11Z is a portion of the third signal path 11 that extends within the second ½ region 72 in the plan view. The signal processing circuit 43 performs, on both the signal of the first pixel 2, which has passed through the first extension portion 4Z, and the signal of the third pixel 9, which has passed through the third extension portion 11Z, corrections that reduce noise components that are superimposed in the second ½ region 72.

In one specific example, the corrections are optical black corrections. In this specific example, the first OB pixel 65 and the first OB path 66, which have been described earlier, are utilized. The signal processing circuit 43 performs optical black corrections on both the signal of the first pixel 2, which has passed through the first extension portion 4Z, and the signal of the third pixel 9, which has passed through the third extension portion 11Z, with use of the signal of the first OB pixel 65, which has passed through the first OB extension portion 66Z.

Figure 18:
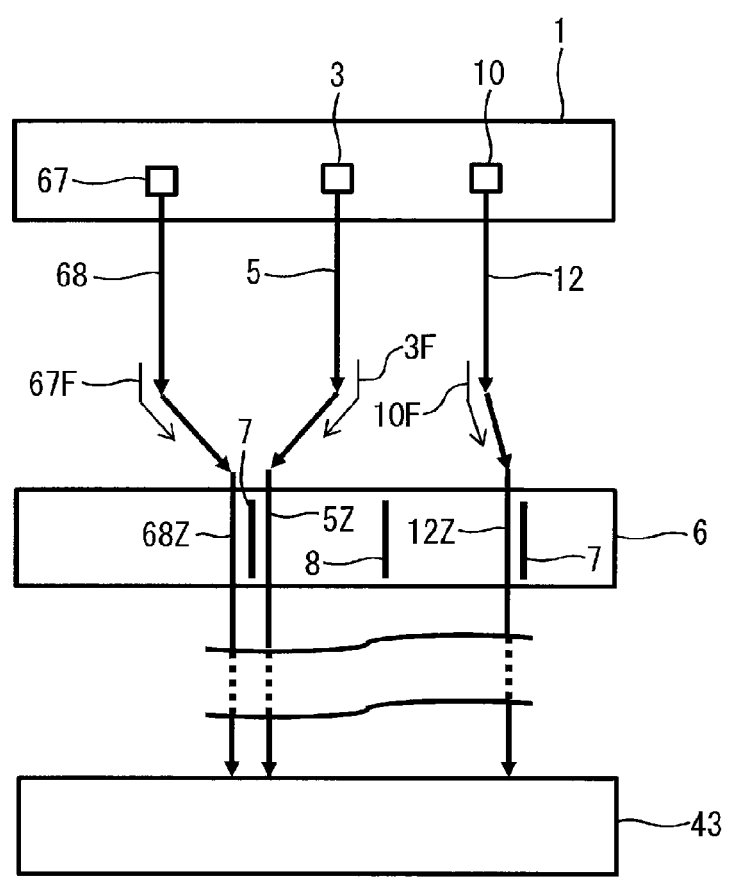
FIG. 18 is an explanatory diagram of signal paths according to the second embodiment.

In the example shown in FIG. 18, the imaging device 100 includes a signal processing circuit 43. The signal processing circuit 43 performs, on both the signal of the second pixel 3, which has passed through the second extension portion 5Z, and the signal of the fourth pixel 10, which has passed through the fourth extension portion 12Z, corrections that reduce noise components that are superimposed in the first region 61. This example makes it easy to apply the same correction conditions to the correction to the signal of the second pixel 3 and the correction to the signal of the fourth pixel 10.

Specifically, for example, the second extension portion 5Z is a portion of the second signal path 5 that extends within the first ½ region 71 in the plan view. The fourth extension portion 12Z is a portion of the fourth signal path 12 that extends within the first ½ region 71 in the plan view. The imaging device 100 performs, on both the signal of the second pixel 3, which has passed through the second extension portion 5Z, and the signal of the fourth pixel 10, which has passed through the fourth extension portion 12Z, corrections that reduce noise components that are superimposed in the first ½ region 71.

In one specific example, the corrections are optical black corrections. In this specific example, the second OB pixel 67 and the second OB path 68, which have been described earlier, are utilized. The signal processing circuit 43 performs optical black corrections on both the signal of the second pixel 3, which has passed through the second extension portion 5Z, and the signal of the fourth pixel 10, which has passed through the fourth extension portion 12Z, with use of the signal of the second OB pixel 67, which has passed through the second OB extension portion 68Z.

The example shown in FIG. 13 is configured such that in the plan view, a portion of the third signal path 11 that extends from the third pixel 9 to the second region 62 and a portion of the fourth signal path 12 that extends from the fourth pixel 10 to the first region 61 do not cross each other.

Specifically, for example, in the plan view, a portion of the third signal path 11 that extends from the third pixel 9 to the second ½ region 72 and a portion of the fourth signal path 12 that extends from the fourth pixel 10 to the first ½ region 71 do not cross each other.

In a first example, the first pixel 2 and the third pixel 9 are each a first type of pixel selected from among four types of pixel consisting of an R pixel, a B pixel, a Gr pixel, and a Gb pixel. The second pixel 3 is a second type of pixel selected from among four types of pixel consisting of an R pixel, a B pixel, a Gr pixel, and a Gb pixel. The first type of pixel and the second type of pixel are different from each other. The first example is suitable to reducing the signal noise of the first and third pixels 2 and 9, each of which is a first type of pixel, with corrections under the same correction conditions.

Furthermore, the fourth pixel 10 may be a second type of pixel. This example is suitable to reducing the signal noise of the second and fourth pixels 3 and 10, each of which is a second type of pixel, with corrections under the same correction conditions.

In a specific example of the first example, all of paths of signals of the pixels of the first type have portions that extend within the first region 61 in the plan view. All of paths of signals of the pixels of the second type have portions that extend in the second region 62 in the plan view.

More specifically, for example, all of the paths of the signals of the pixels of the first type have portions that extend within the first ½ region 71 in the plan view. All of the paths of the signals of the pixels of the second type have portions that extend within the second ½ region 72 in the plan view.

In a second example, the first pixel 2 includes a first color filter. The second pixel 3 includes a second color filter. The third pixel 9 includes a third color filter. The first color filter and the third color filter are color filters of a first color. The second color filter is a color filter of a second color that is different from the first color. The second example is suitable to reducing the signal noise of the first and third pixels 2 and 9, which are pixels including color filters of the first color, with corrections under the same correction conditions.

Furthermore, the fourth pixel 10 may include a fourth color filter of the second color. This example is suitable to reducing the signal noise of the second and fourth pixels 3 and 10, which are pixels including color filters of the second color, with corrections under the same correction conditions.

In a specific example of the second example, all of paths of signals of the pixels including color filters of the first color have portions that extend within the second region 62 in the plan view. All of paths of signals of the pixels including color filters of the second color have portions that extend within the first region 61 in the plan view.

More specifically, all of the paths of the signals of the pixels including color filters of the first color have portions that extend within the second ½ region 72 in the plan view. All of the paths of the signals of the pixels including color filters of the second color have portions that extend within the first ½ region 71 in the plan view.

The example shown in FIG. 16 is configured such that in the plan view, the second signal path 5 and the fourth signal path 12 extend through portions, respectively, of the first region 61 (specifically of the first ½ region 71) based on different first voltage lines 7. Alternatively, in the plan view, the second signal path 5 and the fourth signal path 12 may extend through portions, respectively, of the first region 61 (specifically of the first ½ region 71) based on the same first voltage line 7.

The example shown in FIG. 16 is configured such that in the plan view, the first signal path 4 and the third signal path 11 extend through portions, respectively, of the second region 62 (specifically of the second ½ region 72) based on the same second voltage line 8. Alternatively, in the plan view, the first signal path 4 and the third signal path 11 may extend through portions, respectively, of the second region 62 (specifically of the second ½ region 72) based on different second voltage lines 8.

In the example shown in FIG. 16, the first voltage of the first voltage lines 7 is a power supply voltage. The second voltage of the second voltage lines 8 is a ground voltage. In FIG. 16, the legend "VDD" represents a power supply voltage. The legend "GND" represents a ground voltage. Alternatively, the second voltage may be a power supply voltage, and the first voltage may be a ground voltage.

Incidentally, known examples of measures against noise include providing a shielded line and spreading the spacing between signal paths. However, these measures invite an increase in layout area. On the other hand, the second embodiment achieves measures against noise by providing some signal paths in the first region 61 and other signal paths in the second region 62. That is, the second embodiment achieves measures against noise by providing some signal paths closer to a first voltage line 7 and providing other signal paths closer to a second voltage line 8. This makes it possible to suppress an increase in layout area.

A plurality of signal paths provided within one pixel column pitch may be used to increase speed by parallel processing and reduce noise by giving feedback or the like to the pixel array 1. Such an increase in speed and a reduction in noise are achieved, for example, by an image sensor of a laminated structure. The aforementioned measures against noise make it possible to achieve such an increase in speed and a reduction in noise while suppressing an increase in layout area.

In a case where the first signal path 4 has a feedback path through which feedback is given to the pixel array 1, the feedback path may have a portion that extends within the second region 62 in the plan view. In a case where the second signal path 5 has a feedback path through which feedback is given to the pixel array 1, the feedback path may have a portion that extends within the first region 61 in the plan view. In a case where the third signal path 11 has a feedback path through which feedback is given to the pixel array 1, the feedback path may have a portion that extends within the second region 62 in the plan view. In a case where the fourth signal path 12 has a feedback path through which feedback is given to the pixel array 1, the feedback path may have a portion that extends within the first region 61 in the plan view.

Specifically, in a case where the first signal path 4 has a feedback path through which feedback is given to the pixel array 1, the feedback path may have a portion that extends within the second ½ region 72 in the plan view. In a case where the second signal path 5 has a feedback path through which feedback is given to the pixel array 1, the feedback path may have a portion that extends within the first ½ region 71 in the plan view. In a case where the third signal path 11 has a feedback path through which feedback is given to the pixel array 1, the feedback path may have a portion that extends within the second ½ region 72 in the plan view. In a case where the fourth signal path 12 has a feedback path through which feedback is given to the pixel array 1, the feedback path may have a portion that extends within the first ½ region 71 in the plan view.

In FIG. 13, a second voltage line 8, a first voltage line 7, a second voltage line 8, and a first voltage line 7 are arranged in this order in the plan view. Suppose a case where the first circuit 6 is extended and a second voltage line 8 is further provided at a position indicated by the dotted line D. In this case, the layout of the first signal path 4 may be changed so that the first signal path 4 extends within a portion of the second region 62 (specifically the second ½ region 72) based on the second voltage line 8 at the position indicated by the dotted line D. To generalize, the first signal path 4 may extend within a portion of the second region 62 (specifically the second ½ region 72) based on any of the second voltage lines 8. Similarly, the second signal path 5 may extend within a portion of the first region 61 (specifically the first ½ region 71) based on any of the first voltage lines 7. The same applies to the other signal paths.

As mentioned above, the example shown in FIG. 16 is configured such that in the plan view, the pitch between a plurality of voltage lines 15 and 16 in the second circuit 14 and the pitch between voltage lines 7 and 8 in the first circuit 6 are different from each other. Specifically, for example, the plurality of voltage lines 15 and 16 of the second circuit 14 have one-column pitches. The voltage lines 7 and 8 of the first circuit 6 have not one-column pitches but two-column pitches.

In the plan view, the pitch between a plurality of voltage lines 15 and 16 in the second circuit 14 and the pitch between voltage lines 7 and 8 in the first circuit 6 may be equal to each other.

Situations where the technique according to the second embodiment brings advantages in a case where the pitch between voltage lines 15 and 16 and the pitch between voltage lines 7 and 8 are equal to each other are described with reference to FIGS. 19A and 19B.

Figure 19A:
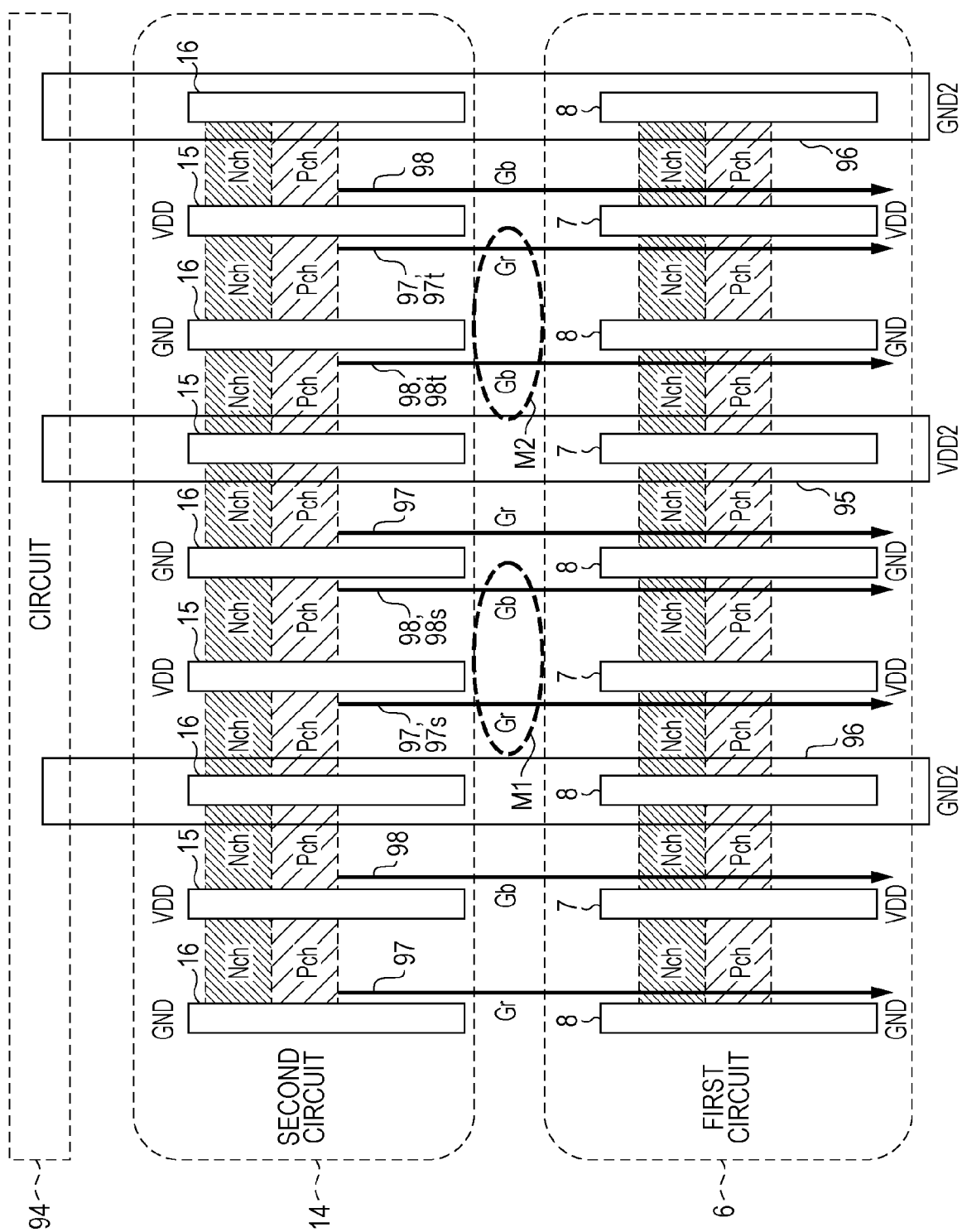
FIG. 19A is an explanatory diagram of signal paths according to the second embodiment.

In the example shown in FIG. 19A, the imaging device 100 includes a different circuit 94 from the first circuit 6 and the second circuit 14. The circuit 94 is supplied with voltages by a plurality of voltage lines 95 and 96. The voltage lines 95 and 96 are power supply lines that are used by the different circuit 94 but can be noise sources for signal paths 97 and 98.

In this example, the voltage of the voltage line 95 is a power supply voltage. The voltage of the voltage line 96 is a ground voltage. In FIG. 19A, the legend "VDD2" represents a power supply voltage. The legend "GND2" represents a ground voltage. Alternatively, the voltage of the voltage line 96 may be a power supply voltage, and the voltage of the voltage line 95 may be a ground voltage.

The example shown in FIG. 19A is configured such that in the plan view, a signal path 97 of a signal of a Gr pixel and a signal path 98 of a signal of a Gb pixel are alternately and repeatedly arranged. In the plan view, spacings between signal paths 97 and 98 and voltage lines 95 and 96 are secured. This suppresses the superimposition of noise from the voltage lines 95 and 96 onto signals of the signal paths 97 and 98.

Figure 19B:
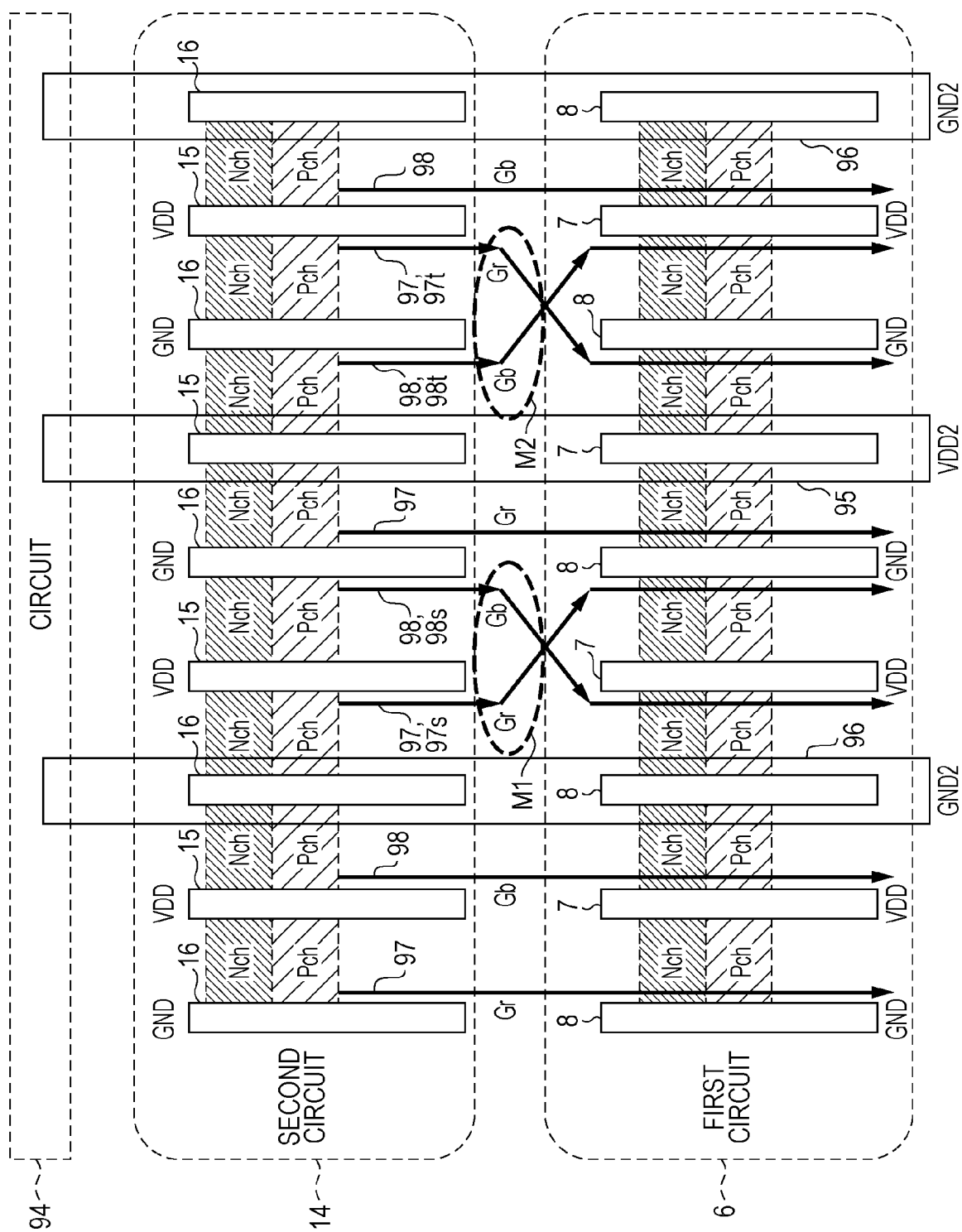
FIG. 19B is an explanatory diagram of signal paths according to the second embodiment.

For further noise reduction, as shown in FIG. 19B, a crossing of a signal path 97s and a signal path 98s in a region M1 in the plan view allows the signal path 97s to extend through a place closer to a second voltage line 8 and the signal path 98s to extend through a place closer to a first voltage line 7. A crossing of a signal path 97t and a signal path 98t in a region M2 in the plan view allows the signal path 97t to extend through a place closer to a second voltage line 8 and the signal path 98t to extend through a place closer to a first voltage line 7. This achieves a configuration in which in the plan view, every signal path 97 extends through a place closer to a second voltage line 8 and every signal path 98 extends through a place closer to a first voltage line 7. This makes it possible to suitably reduce the noise of signals of a plurality of signal paths 97 by performing, on these signals, corrections that reduce noise derived from the second voltage lines 8, and also makes it possible to suitably reduce the noise of signals of a plurality of signal paths 98 by performing, on these signals, corrections that reduce noise derived from the first voltage lines 7. For such a reason, the technique according to the second embodiment brings advantages even in a case where the pitch between voltage lines 15 and 16 and the pitch between voltage lines 7 and 8 are equal to each other. Note here that a place closer to a first voltage line 7 in the plan view corresponds to the first region 61 or, specifically, corresponds, for example, to the first ½ region 71. A place closer to a second voltage line 8 in the plan view corresponds to the second region 62 or, specifically, corresponds, for example, to the second ½ region 72.

The example shown in FIG. 19B is configured such that in the second circuit 14, a signal path 97 extends through a place closer to a third voltage line 15 and another signal path 97 extends through a place closer to a fourth voltage line 16. In the second circuit 14, a signal path 98 extends through a place closer to a third voltage line 15, and another signal path 98 extends through a place closer to a fourth voltage line 16. This does not necessarily present a problem with measures against noise. For example, in a case where the second circuit 14 is short in length, the effect of superimposition of noise in the second circuit 14 is limited. Also in a case where the signal paths 97 and 98, whose noise needs to be suppressed, and the voltage lines 15 and 16, which can be noise sources, run side by side only for a short distance, the effect of superimposition of noise in the second circuit 14 is limited. Further, the effect of superimposition of noise may be suppressed by a shield or the like in the second circuit 14.

Third Embodiment

The following describes a third embodiment. In the third embodiment, contents which are identical to those of the second embodiment are given the same signs and are not described.

Figure 20:
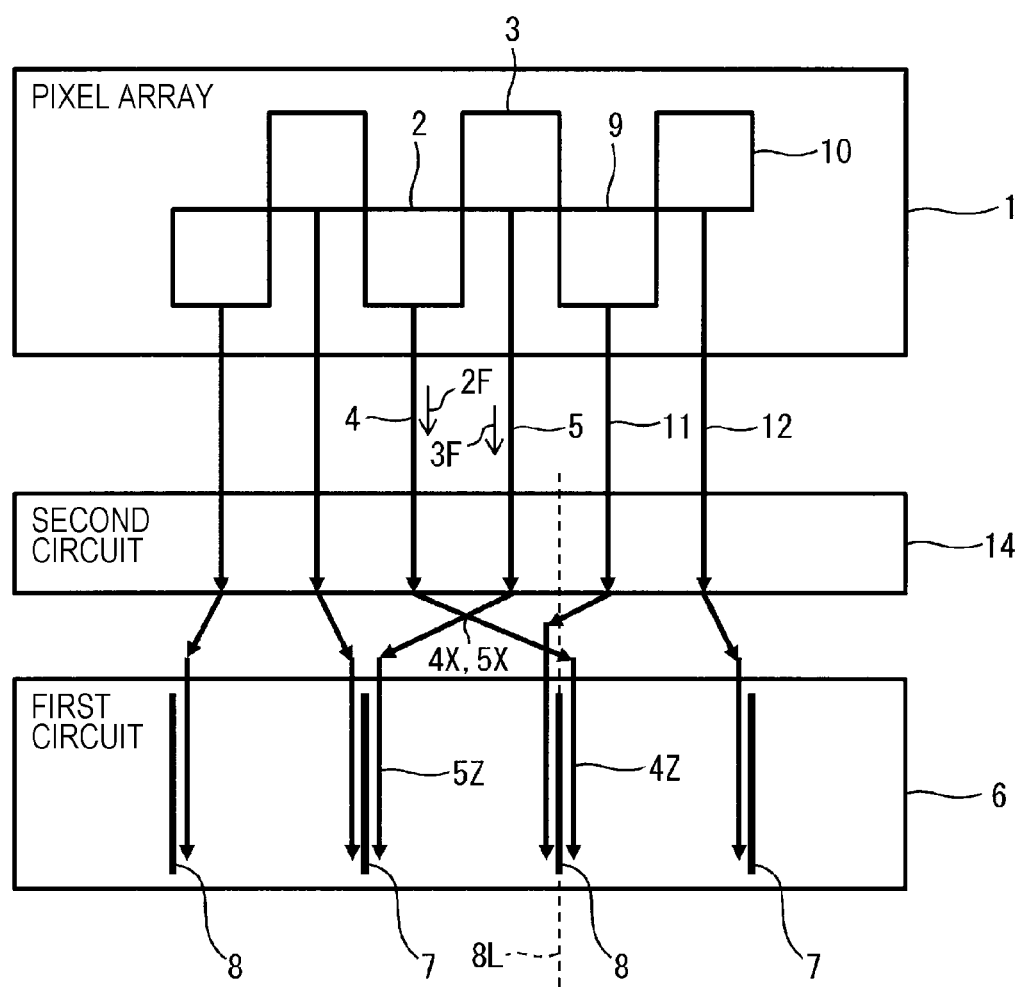
FIG. 20 is an explanatory diagram of signal paths according to a third embodiment.

As shown in FIG. 20, the third embodiment is configured such that in the plan view, a portion 4X of the first signal path 4 where the first signal path 4 crosses the second signal path 5, a portion of the first signal path 4 where the first signal path 4 crosses the third signal path 11, a portion of the first signal path 4 where the first signal path 4 crosses a straight line 8L including a second voltage line 8, and a portion 4Z of the first signal line 4 that extends within the second region 62 are arranged in this order along a direction of flow 2F of the signal of the first pixel 2.

Specifically, for example, in the plan view, a portion 4X of the first signal path 4 where the first signal path 4 crosses the second signal path 5, a portion of the first signal path 4 where the first signal path 4 crosses the third signal path 11, a portion of the first signal path 4 where the first signal path 4 crosses a straight line 8L including a second voltage line 8, and a portion 4Z of the first signal line 4 that extends within the second ½ region 72 are arranged in this order along the direction of flow 2F of the signal of the first pixel 2.

In the plan view, a portion of the third signal path 11 where the third signal path 11 crosses the straight line 8L including the second voltage line 8, a portion of the third signal path 11 where the third signal path 11 crosses the first signal path 4, and a portion of the third signal path 11 that extends within the second region 62 are arranged in this order along a direction of flow of the signal of the third pixel 9.

Specifically, for example, in the plan view, a portion of the third signal path 11 where the third signal path 11 crosses the straight line 8L including the second voltage line 8, a portion of the third signal path 11 where the third signal path 11 crosses the first signal path 4, and a portion of the third signal path 11 that extends within the second ½ region 72 are arranged in this order along the direction of flow of the signal of the third pixel 9.

The example shown in FIG. 20 is configured such that in the plan view, the first signal path 4, the second signal path 5, the third signal path 11, and the fourth signal path 12 are arranged in this order at an output from the pixel array 1. In the plan view, the second signal path 5, the third signal path 11, the first signal path 4, and the fourth signal path 12 are arranged in this order in a region closer to the first circuit 6 than the crossing portions 4X and 5X.

The third embodiment is configured such that in the plan view, the portion 4X of the first signal path 4 where the first signal path 4 crosses the second signal path 5 and the portion of the first signal path 4 where the first signal path 4 crosses the third signal path 11 are arranged side by side. In the plan view, the first signal path 4 may cross still another signal path. That is, in the plan view, the number of crossings where the first signal path 4 crosses other signal paths may be two or may be three or more.

The third embodiment is configured such that in the plan view, the first signal path 4 has a portion where the first signal path 4 crosses a straight line 8L including one second voltage line 8. In the plan view, the first signal path 4 may cross a straight line including still another voltage line. That is, in the plan view, the number of crossings where the first signal path 4 crosses straight lines including voltage lines may be one or may be two or more.

Fourth Embodiment

The following describes a fourth embodiment. In the fourth embodiment, contents which are identical to those of the first embodiment are given the same signs and are not described.

In the first embodiment or other embodiments, corrections for reducing noise are performed inside the imaging device 100. Alternatively, corrections for reducing noise may be performed outside the imaging device 100. The following describes the fourth embodiment with reference to FIGS. 21A to 21C. Although not shown in FIG. 21A, the AD conversion circuit 40 or other components may be provided between the first circuit 6 and the output circuit 44.

Employable examples of the corrections include optical black corrections. For optical black corrections, a technique involving the use of a first OB pixel 65 and a first OB path 66, which have been described earlier, may be utilized. For optical black corrections, a technique involving the use of a second OB pixel 67 and a second OB path 68, which have been described earlier, may be utilized.

Figure 21B:
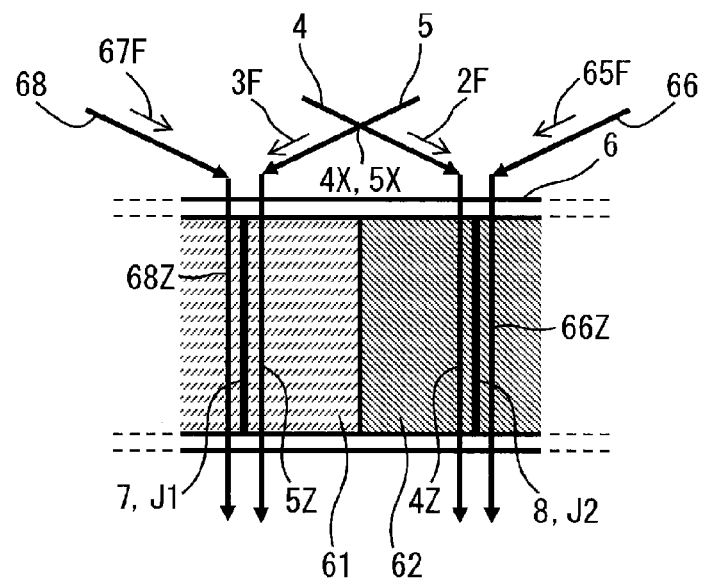
FIG. 21B is an explanatory diagram of signal paths according to the fourth embodiment.
Figure 21C:
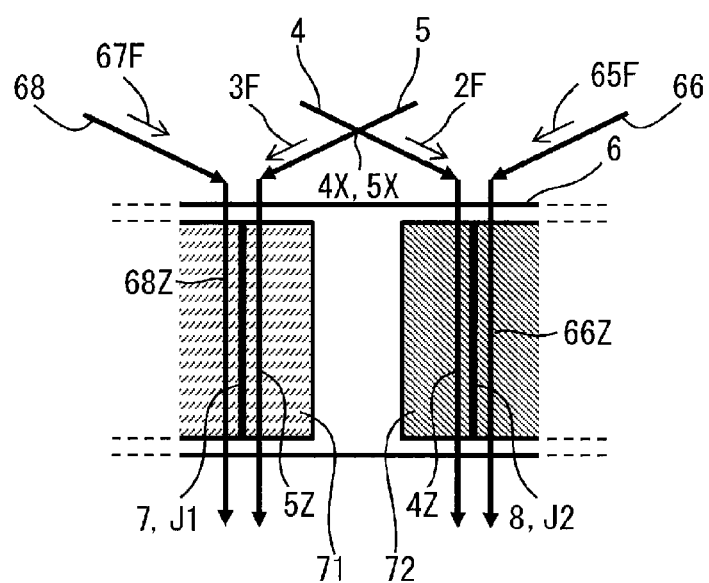
FIG. 21C is an explanatory diagram of signal paths according to the fourth embodiment.

In one specific example, an imaging system 200 shown in FIGS. 21A to 21C includes an imaging device 100 and a signal processing device 18 provided outside the imaging device 100. The plurality of pixels include a first OB pixel 65, which is an optical black pixel. The imaging device 100 includes a first OB path 66 through which a signal of the first OB pixel 65 flows. In the plan view, the first OB path 66 has a first OB extension portion 66Z that extends within the second region 62. The signal processing device 18 performs an optical black correction on the signal of the first pixel 2, which has passed through the first extension portion 4Z, with use of the signal of the first OB pixel 65, which has passed through the first OB extension portion 66Z.

Specifically, for example, the first OB extension portion 66Z is a portion of the first OB path 66 that extends within the second ½ region 72 in the plan view. The first extension portion 4Z is a portion of the first signal path 4 that extends within the second ½ region 72 in the plan view.

In one specific example, an imaging system 200 shown in FIGS. 21A to 21C includes an imaging device 100 and a signal processing device 18 provided outside the imaging device 100. The plurality of pixels include a second OB pixel 67, which is an optical black pixel. The imaging device 100 includes a second OB path 68 through which a signal of the second OB pixel 67 flows. In the plan view, the second OB path 68 has a second OB extension portion 68Z that extends within the first region 61. The signal processing device 18 performs an optical black correction on the signal of the second pixel 3, which has passed through the second extension portion 5Z, with use of the signal of the second OB pixel 67, which has passed through the second OB extension portion 68Z.

Specifically, for example, the second OB extension portion 68Z is a portion of the second OB path 68 that extends within the first ½ region 71 in the plan view. The second extension portion 5Z is a portion of the second signal path 5 that extends within the first ½ region 71 in the plan view.

Figure 22A:
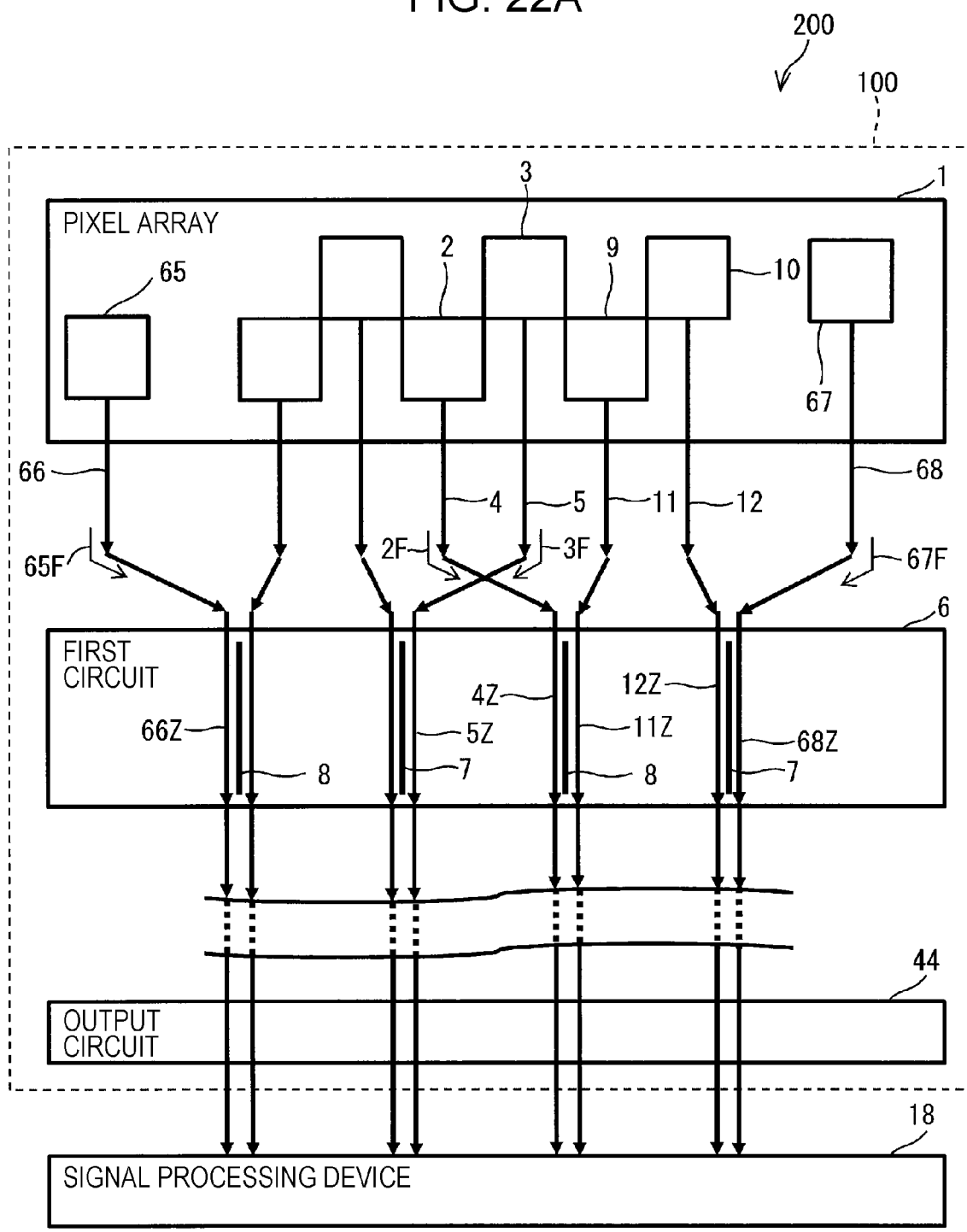
FIG. 22A is an explanatory diagram of signal paths according to the fourth embodiment.
Figure 22B:
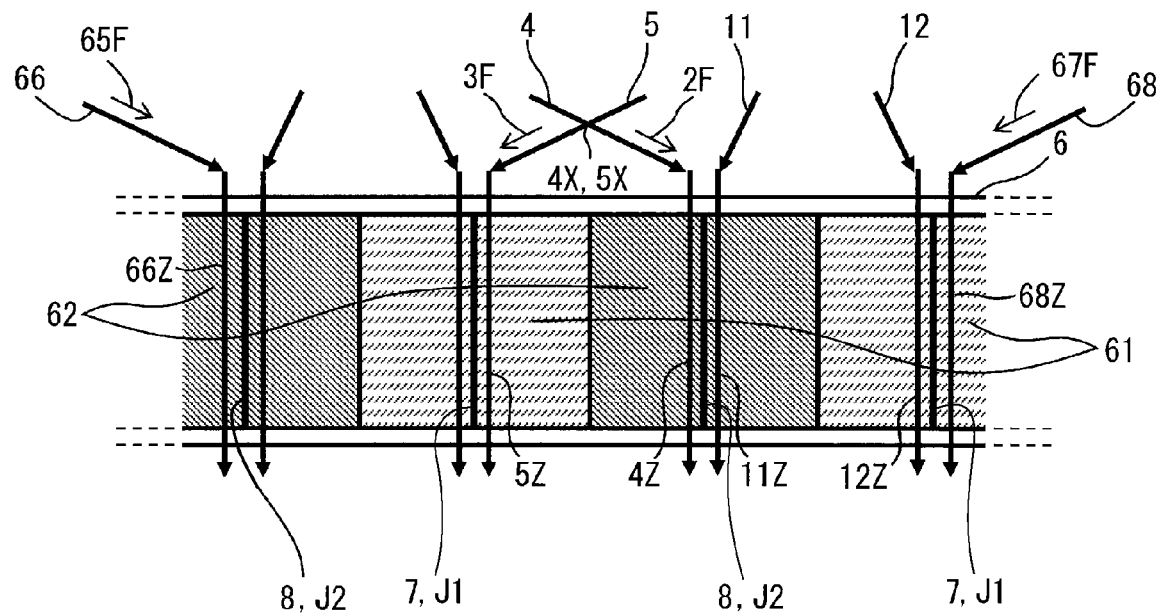
FIG. 22B is an explanatory diagram of signal paths according to the fourth embodiment.
Figure 22C:
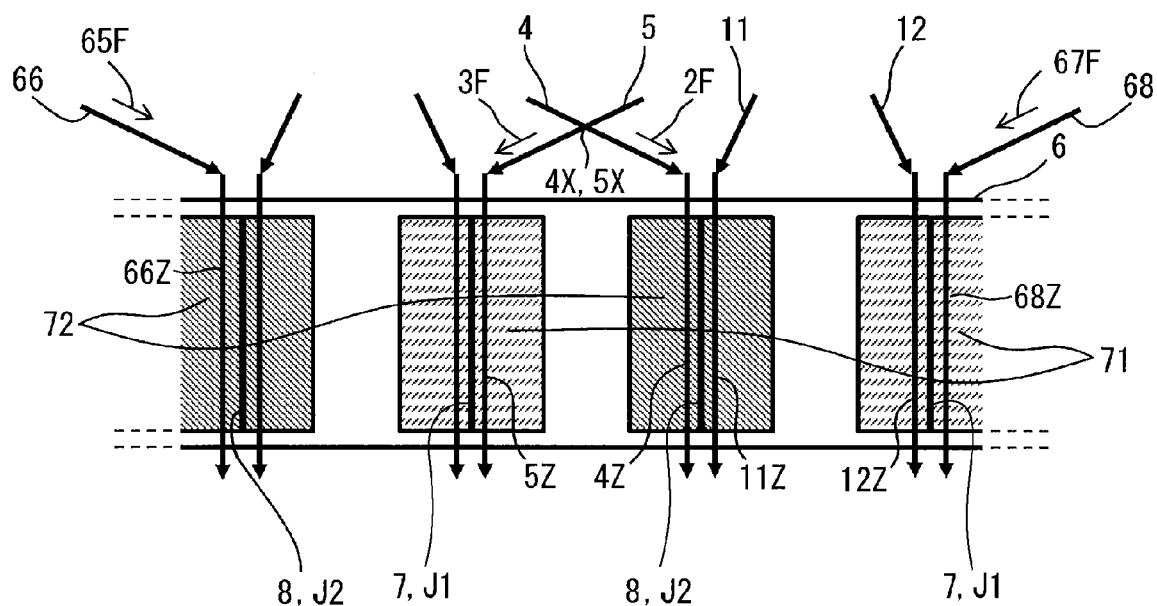
FIG. 22C is an explanatory diagram of signal paths according to the fourth embodiment.

The corrections described in the second embodiment may be performed outside the imaging device 100. An imaging system 200 suitable to a case where such corrections are performed is shown in FIGS. 22A to 22C. The imaging system 200 of FIGS. 22A to 22C includes an imaging device 100 and a signal processing device 18 provided outside the imaging device 100. The signal processing device 18 performs, on both the signal of the first pixel 2, which has passed through the first extension portion 4Z, and the signal of the third pixel 9, which has passed through the third extension portion 11Z, corrections that reduce noise components that are superimposed in the second region 62.

Specifically, for example, the first extension portion 4Z is a portion of the first signal path 4 that extends within the second ½ region 72 in the plan view. The third extension portion 11Z is a portion of the third signal path 11 that extends within the second ½ region 72 in the plan view. The signal processing device 18 performs, on both the signal of the first pixel 2, which has passed through the first extension portion 4Z, and the signal of the third pixel 9, which has passed through the third extension portion 11Z, corrections that reduce noise components that are superimposed in the second ½ region 72.

In one specific example, the corrections are optical black corrections. In this specific example, the first OB pixel 65 and the first OB path 66, which have been described earlier, are utilized. The signal processing device 18 performs optical black corrections on both the signal of the first pixel 2, which has passed through the first extension portion 4Z, and the signal of the third pixel 9, which has passed through the third extension portion 11Z, with use of the signal of the first OB pixel 65, which has passed through the first OB extension portion 66Z.

In one example, the signal processing device 18 performs, on both the signal of the second pixel 3, which has passed through the second extension portion 5Z, and the signal of the fourth pixel 10, which has passed through the fourth extension portion 12Z, corrections that reduce noise components that are superimposed in the first region 61.

Specifically, for example, the second extension portion 5Z is a portion of the second signal path 5 that extends within the first ½ region 71 in the plan view. The fourth extension portion 12Z is a portion of the fourth signal path 12 that extends within the first ½ region 71 in the plan view. The signal processing device 18 performs, on both the signal of the second pixel 3, which has passed through the second extension portion 5Z, and the signal of the fourth pixel 10, which has passed through the fourth extension portion 12Z, corrections that reduce noise components that are superimposed in the first ½ region 71.

In one specific example, the corrections are optical black corrections. In this specific example, the second OB pixel 67 and the second OB path 68, which have been described earlier, are utilized. The signal processing device 18 performs optical black corrections on both the signal of the second pixel 3, which has passed through the second extension portion 5Z, and the signal of the fourth pixel 10, which has passed through the fourth extension portion 12Z, with use of the signal of the second OB pixel 67, which has passed through the second OB extension portion 68Z.

The technique for performing corrections outside an imaging device 100 is also applicable to other embodiments.

Fifth Embodiment

The following describes a fifth embodiment. In the fifth embodiment, contents which are identical to those of the first embodiment are given the same signs and are not described.

Figure 23:
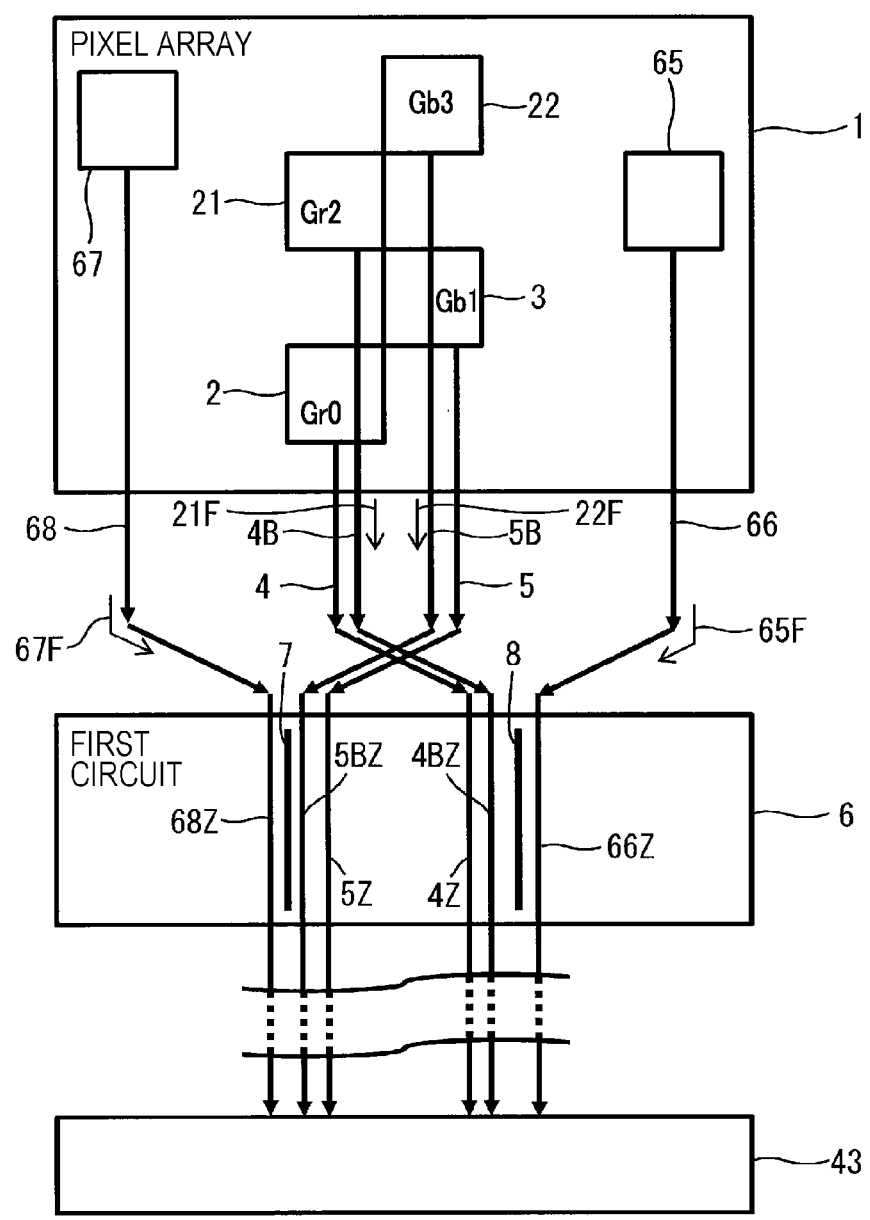
FIG. 23 is an explanatory diagram of signal paths according to a fifth embodiment.

FIG. 23 shows a pixel array 1 and a first circuit 6 according to the fifth embodiment.

As shown in FIG. 23, in the pixel array 1 according to the fifth embodiment, the plurality of pixels include a third pixel 21 and a fourth pixel 22 in addition to the first pixel 2 and the second pixel 3.

In the example shown in FIG. 23, the first pixel 2 and the third pixel 21 belong to the same column of the pixel array 1. The second pixel 3 and the fourth pixel 22 belong to the same column of the pixel array 1. The column to which the first pixel 2 and the third pixel 21 belong and the column to which the second pixel 3 and the fourth pixel 22 belong are adjacent to each other.

In a first example, the first pixel 2 and the third pixel 21 are each a first type of pixel selected from among four types of pixel consisting of an R pixel, a B pixel, a Gr pixel, and a Gb pixel. The second pixel 3 and the fourth pixel 22 are each a second type of pixel selected from among four types of pixel consisting of an R pixel, a B pixel, a Gr pixel, and a Gb pixel. Specifically, for example, the first pixel 2 and the third pixel 21 are Gr pixels. The second pixel 3 and the fourth pixel 22 are Gb pixels.

In a second example, the first pixel 2 and the third pixel 21 are pixels of a first color. The second pixel 3 and the fourth pixel 22 are pixels of a second color. Specifically, for example, the first pixel 2 and the third pixel 21 include color filters of the first color. The second pixel 3 and the fourth pixel 22 include color filters of the second color.

In the following, a path through which a signal of the third pixel 21 flows is sometimes referred to as "third signal path 4B". A path through which a signal of the fourth pixel 22 flows is sometimes referred to as "fourth signal path 5B".

The example shown in FIG. 23 is configured such that in the plan view, the first signal path 4, the third signal path 4B, the fourth signal path 5B, and the second signal path 5 are arranged in this order at an output from the pixel array 1. In the plan view, the fourth signal path 5B, the second signal path 5, the first signal path 4, and the third signal path 4B are arranged in this order in a region closer to the first circuit 6 than the crossing portions 4X and 5X.

The example shown in FIG. 23 is configured such that in the plan view, a crossing portion 4X of the first signal path 4 where the first signal path 4 crosses the second signal path 5 and a first extension portion 4Z of the first signal path 4 that extends within the second region 62 are arranged in this order along a direction of flow 2F of the signal of the first pixel 2. In the plan view, a crossing portion of the third signal path 4B where the third signal path 4B crosses the fourth signal path 5B and a third extension portion 4BZ of the third signal path 4B that extends within the second region 62 are arranged in this order along a direction of flow 21F of the signal of the third pixel 21. Such a layout makes it easy to make corrections for reducing the noise of the signal of the first pixel 2 and the signal of the third pixel 21. Specifically, for example, such a layout makes it harder for variations in noise components that are superimposed onto the signal of the first pixel 2 and the signal of the third pixel 21 in the first circuit 6 to occur than in a case where either one of the first and third signal paths 4 and 4B extends within the second region 62 and the other one of the first and third signal paths 4 and 4B extends within the first region 61. For this reason, such a layout is suitable to reducing the noise of these signals with corrections under the same correction conditions.

The example shown in FIG. 23 is configured such that in the plan view, a crossing portion 5X of the second signal path 5 where the second signal path 5 crosses the first signal path 4 and a second extension portion 5Z of the second signal path 5 that extends within the first region 61 are arranged in this order along a direction of flow 3F of the signal of the second pixel 3. In the plan view, a crossing portion of the fourth signal path 5B where the fourth signal path 5B crosses the third signal path 4B and a fourth extension portion 5BZ of the fourth signal path 5B that extends within the first region 61 are arranged in this order along a direction of flow 22F of the signal of the fourth pixel 22. Such a layout makes it easy to make corrections for reducing the noise of the signal of the second pixel 3 and the signal of the fourth pixel 22. Specifically, for example, such a layout makes it harder for variations in noise components that are superimposed onto the signal of the second pixel 3 and the signal of the fourth pixel 22 in the first circuit 6 to occur than in a case where either one of the second and fourth signal paths 5 and 5B extends within the first region 61 and the other one of the second and fourth signal paths 5 and 5B extends within the second region 62. For this reason, such a layout is suitable to reducing the noise of these signals with corrections under the same correction conditions.

Specifically, for example, the first extension portion 4Z is a portion of the first signal path 4 that extends within the second ½ region 72 in the plan view. The third extension portion 4BZ is a portion of the third signal path 4B that extends within the second ½ region 72 in the plan view. The second extension portion 5Z is a portion of the second signal path 5 that extends within the first ½ region 71 in the plan view. The fourth extension portion 5BZ is a portion of the fourth signal path 5B that extends within the first ½ region 71 in the plan view.

An example of how to make corrections for reducing noise is described. In the example shown in FIG. 23, the signal processing circuit 43 performs, on both the signal of the first pixel 2, which has passed through the first extension portion 4Z, and the signal of the third pixel 21, which has passed through the third extension portion 4BZ, corrections that reduce noise components that are superimposed in the second region 62. This example makes it easy to apply the same correction conditions to the correction to the signal of the first pixel 2 and the correction to the signal of the third pixel 21.

Specifically, for example, the first extension portion 4Z is a portion of the first signal path 4 that extends within the second ½ region 72 in the plan view. The third extension portion 4BZ is a portion of the third signal path 4B that extends within the second ½ region 72 in the plan view. The signal processing circuit 43 performs, on both the signal of the first pixel 2, which has passed through the first extension portion 4Z, and the signal of the third pixel 21, which has passed through the third extension portion 4BZ, corrections that reduce noise components that are superimposed in the second ½ region 72.

In one specific example, the corrections are optical black corrections. In this specific example, the first OB pixel 65 and the first OB path 66, which have been described earlier, are utilized. The signal processing circuit 43 performs optical black corrections on both the signal of the first pixel 2, which has passed through the first extension portion 4Z, and the signal of the third pixel 21, which has passed through the third extension portion 4BZ, with use of the signal of the first OB pixel 65, which has passed through the first OB extension portion 66Z.

In the example shown in FIG. 23, the signal processing circuit 43 performs, on both the signal of the second pixel 3, which has passed through the second extension portion 5Z, and the signal of the fourth pixel 22, which has passed through the fourth extension portion 5BZ, corrections that reduce noise components that are superimposed in the first region 61. This example makes it easy to apply the same correction conditions to the correction to the signal of the second pixel 3 and the correction to the signal of the fourth pixel 22.

Specifically, for example, the second extension portion 5Z is a portion of the second signal path 5 that extends within the first ½ region 71 in the plan view. The fourth extension portion 5BZ is a portion of the fourth signal path 5B that extends within the first ½ region 71 in the plan view. The signal processing circuit 43 performs, on both the signal of the second pixel 3, which has passed through the second extension portion 5Z, and the signal of the fourth pixel 22, which has passed through the fourth extension portion 5BZ, corrections that reduce noise components that are superimposed in the first ½ region 71.

In one specific example, the corrections are optical black corrections. In this specific example, the second OB pixel 67 and the second OB path 68, which have been described earlier, are utilized. The signal processing circuit 43 performs optical black corrections on both the signal of the second pixel 3, which has passed through the second extension portion 5Z, and the signal of the fourth pixel 22, which has passed through the fourth extension portion 5BZ, with use of the signal of the second OB pixel 67, which has passed through the second OB extension portion 68Z.

The first example is suitable to reducing the noise of the signals of the first and third pixels 2 and 21, each of which is a first type of pixel, with corrections under the same correction conditions. The first example is suitable to reducing the noise of the signals of the second and fourth pixels 3 and 22, each of which is a second type of pixel, with corrections under the same correction conditions.

The second example is suitable to reducing the noise of the signals of the first and third pixels 2 and 21, which are pixels including color filters of the first color, with corrections under the same correction conditions. The second example is suitable to reducing the noise of the signals of the second and fourth pixels 3 and 22, which are pixels including color filters of the second color, with corrections under the same correction conditions.

Figure 24:
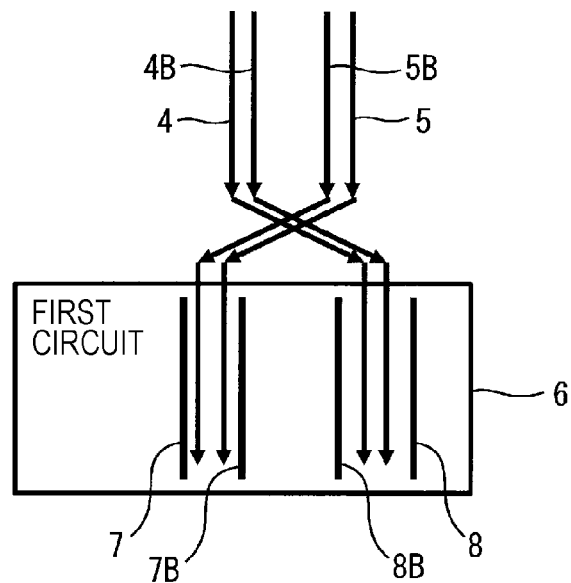
FIG. 24 is an explanatory diagram of signal paths according to the fifth embodiment.

As shown in FIG. 24, a first voltage line 7B may be added. To the first voltage line 7B, the first voltage is applied, as is the case with the first voltage line 7. The example shown in FIG. 24 is configured such that in the plan view, the first voltage line 7, the fourth signal path 5B, the second signal path 5, and the first voltage line 7B are arranged in this order. Moreover, in the plan view, the distance between the first voltage line 7 and the fourth signal path 5B and the distance between the second signal path 5 and the first voltage line 7B are equal to each other. This reduces the difference between noise that is superimposed onto a signal of the fourth signal path 5B in the first region 61 and noise that is superimposed onto a signal of the second signal path 5 in the first region 61. For this reason, the example shown in FIG. 24 is suitable to reducing the noise of the signals of the second and fourth pixels 3 and 22 with corrections under the same correction conditions.

As shown in FIG. 24, a second voltage line 8B may be added. To the second voltage line 8B, the second voltage is applied, as is the case with the second voltage line 8. The example shown in FIG. 24 is configured such that in the plan view, the second voltage line 8B, the first signal path 4, the third signal path 4B, and the second voltage line 8 are arranged in this order. Moreover, in the plan view, the distance between the second voltage line 8B and the first signal path 4 and the distance between the third signal path 4B and the second voltage line 8 are equal to each other. This reduces the difference between noise that is superimposed onto a signal of the first signal path 4 in the second region 62 and noise that is superimposed onto a signal of the third signal path 4B in the second region 62. For this reason, the example shown in FIG. 24 is suitable to reducing the noise of the signals of the first and third pixels 2 and 21 with corrections under the same correction conditions.

Figure 25:
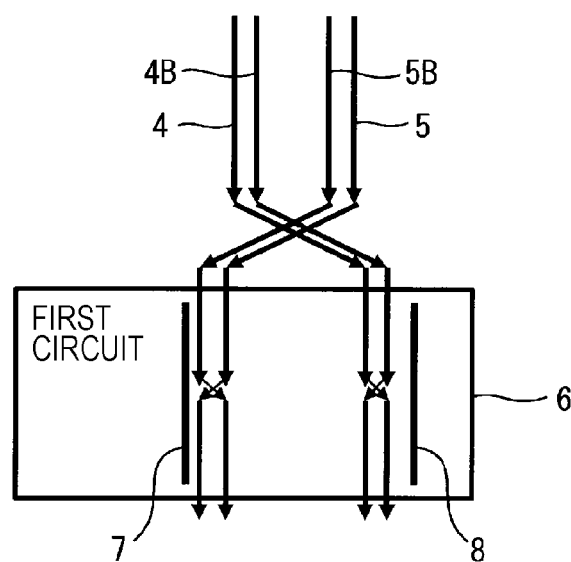
FIG. 25 is an explanatory diagram of signal paths according to the fifth embodiment.

As shown in FIG. 25, in the plan view, the first signal path 4 and the third signal path 4B may cross each other at a middle point of the length of the second voltage line 8. Note here that the middle point is the middle one of three equal parts into which the length is divided or, specifically, is for example a position at which the length is divided into two equal parts. This makes it possible to reduce the difference between the coupling capacitance between the first signal path 4 and the second voltage line 8 and the coupling capacitance between the third signal path 4B and the second voltage line 8. This reduces the difference between noise that is superimposed onto a signal of the first signal path 4 in the second region 62 and noise that is superimposed onto a signal of the third signal path 4B in the second region 62. For this reason, the example shown in FIG. 25 is suitable to reducing the noise of the signals of the first and third pixels 2 and 21 with corrections under the same correction conditions.

As shown in FIG. 25, in the plan view, the second signal path 5 and the fourth signal path 5B may cross each other at a middle point of the length of the first voltage line 7. Note here that the middle point is the middle one of three equal parts into which the length is divided or, specifically, is for example a position at which the length is divided into two equal parts. This makes it possible to reduce the difference between the coupling capacitance between the second signal path 5 and the first voltage line 7 and the coupling capacitance between the fourth signal path 5B and the first voltage line 7. This reduces the difference between noise that is superimposed onto a signal of the second signal path 5 in the first region 61 and noise that is superimposed onto a signal of the fourth signal path 5B in the first region 61. For this reason, the example shown in FIG. 25 is suitable to reducing the noise of the signals of the second and fourth pixels 3 and 22 with corrections under the same correction conditions.

Sixth Embodiment

The following describes a sixth embodiment. In the sixth embodiment, contents which are identical to those of the second embodiment are given the same signs and are not described.

Figure 26:
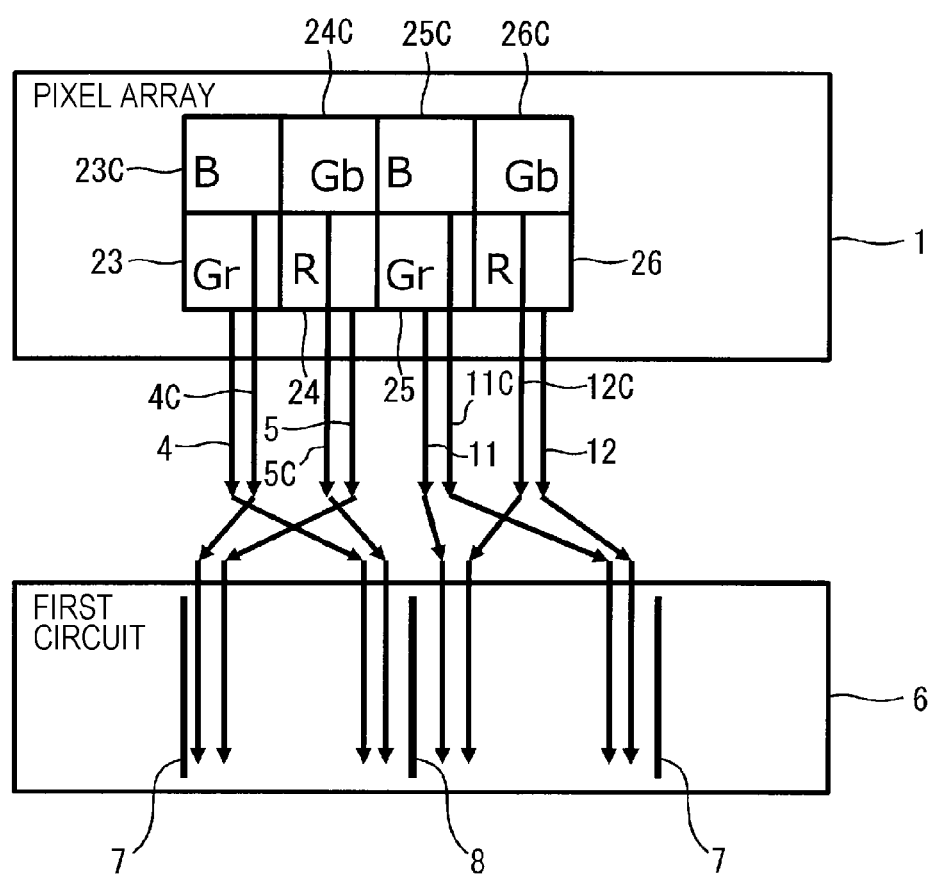
FIG. 26 is an explanatory diagram of signal paths according to a sixth embodiment.

FIG. 26 shows a pixel array 1 and a first circuit 6 according to the sixth embodiment.

As shown in FIG. 26, in the pixel array 1 according to the sixth embodiment, the plurality of pixels include a first pixel 23, a second pixel 24, a third pixel 25, a fourth pixel 26, a fifth pixel 23C, a sixth pixel 24C, a seventh pixel 25C, and an eighth pixel 26C.

In the following, a path through which a signal of the first pixel 23 flows is sometimes referred to as "first signal path 4". A path through which a signal of the second pixel 24 flows is sometimes referred to as "second signal path 5". A path through which a signal of the third pixel 25 flows is sometimes referred to as "third signal path 11". A path through which a signal of the fourth pixel 26 flows is sometimes referred to as "fourth signal path 12". A path through which a signal of the fifth pixel 23C flows is sometimes referred to as "fifth signal path 4C". A path through which a signal of the sixth pixel 24C flows is sometimes referred to as "sixth signal path 5C". A path through which a signal of the seventh pixel 25C flows is sometimes referred to as "seventh signal path 11C". A path through which a signal of the eighth pixel 26C flows is sometimes referred to as "eighth signal path 12C".

The first signal path 4, the second signal path 5, the third signal path 11, and the fourth signal path 12 may have the same features as those of the second embodiment. For example, in the plan view, the first signal path 4 and the second signal path 5 cross each other.

In the plan view, the fifth signal path 4C has a portion that extends within the first region 61. In the plan view, the sixth signal path 5C has a portion that extends within the second region 62. In the plan view, the seventh signal path 11C has a portion that extends within the first region 61. In the plan view, the eighth signal path 12C has a portion that extends within the second region 62.

Specifically, for example, in the plan view, the fifth signal path 4C has a portion that extends within the first ½ region 71. In the plan view, the sixth signal path 5C has a portion that extends within the second ½ region 72. In the plan view, the seventh signal path 11C has a portion that extends within the first ½ region 71. In the plan view, the eighth signal path 12C has a portion that extends within the second ½ region 72.

This example is configured such that in the plan view, the second signal path 5, the fourth signal path 12, the fifth signal path 4C, and the seventh signal path 11C have portions that extend within the first region 61. Specifically, for example, in the plan view, the second signal path 5, the fourth signal path 12, the fifth signal path 4C, and the seventh signal path 11C have portions that extend within the first ½ region 71. For this reason, the second signal path 5, the fourth signal path 12, the fifth signal path 4C, and the seventh signal path 11C hardly suffer from variations in noise components that are superimposed onto the signals in the first circuit 6. For this reason, this example is suitable to reducing the noise of these signals with corrections under the same correction conditions. These signals can be subjected to the aforementioned corrections that reduce noise components that are superimposed in the first region 61. Specifically, for example, these signal can be subjected to the aforementioned corrections that reduce noise components that are superimposed in the first ½ region 71.

This example is configured such that in the plan view, the first signal path 4, the third signal path 11, the sixth signal path 5C, and the eighth signal path 12C have portions that extend within the second region 62. Specifically, for example, in the plan view, the first signal path 4, the third signal path 11, the sixth signal path 5C, and the eighth signal path 12C have portions that extend within the second ½ region 72. For this reason, the first signal path 4, the third signal path 11, the sixth signal path 5C, and the eighth signal path 12C hardly suffer from variations in noise components that are superimposed onto the signals in the first circuit 6. For this reason, this example is suitable to reducing the noise of these signals with corrections under the same correction conditions. These signals can be subjected to the aforementioned corrections that reduce noise components that are superimposed in the second region 62. Specifically, for example, these signal can be subjected to the aforementioned corrections that reduce noise components that are superimposed in the second ½ region 72.

The example shown in FIG. 26 is configured such that in the plan view, the first signal path 4, the fifth signal path 4C, the sixth signal path 5C, the second signal path 5, the third signal path 11, the seventh signal path 11C, the eighth signal path 12C, and the fourth signal path 12 are arranged in this order at an output from the pixel array 1. In the plan view, the fifth signal path 4C, the second signal path 5, the first signal path 4, the sixth signal path 5C, the third signal path 11, the eighth signal path 12C, the seventh signal path 11C, and the fourth signal path 12 are arranged in this order in a region closer to the first circuit 6 than the crossing portions 4X and 5X.

In the plan view, crossings of the paths are made so that there is a difference in arrangement of the paths between the output from the pixel array 1 and the region closer to the first circuit 6. Specifically, for example, the first signal path 4 and the fifth signal path 4C cross each other between the output from the pixel array 1 and the region closer to the first circuit 6. The second signal path 5 and the sixth signal path 5C cross each other between the output from the pixel array 1 and the region closer to the first circuit 6. The first signal path 4 and the second signal path 5 cross each other between the output from the pixel array 1 and the region closer to the first circuit 6. The seventh signal path 11C and the eighth signal path 12C cross each other between the output from the pixel array 1 and the region closer to the first circuit 6.

In the example shown in FIG. 26, the first pixel 23 and the fifth pixel 23C belong to the same column of the pixel array 1. The second pixel 24 and the sixth pixel 24C belong to the same column of the pixel array 1. The third pixel 25 and the seventh pixel 25C belong to the same column of the pixel array 1. The fourth pixel 26 and the eighth pixel 26C belong to the same column of the pixel array 1. These four columns are arranged adjacent to one another in the order named.

In a first example, the first pixel 23 and the third pixel 25 are each a first type of pixel selected from among four types of pixel consisting of an R pixel, a B pixel, a Gr pixel, and a Gb pixel. The second pixel 24 and the fourth pixel 26 are each a second type of pixel selected from among the four types. The fifth pixel 23C and the seventh pixel 25C are each a third type of pixel selected from among the four types. The sixth pixel 24C and the eighth pixel 26C are each a fourth type of pixel selected from among the four types. The first type of pixel, the second type of pixel, the third type of pixel, and the fourth type of pixel are different from one another.

Specifically, for example, the first pixel 23 and the third pixel 25 are Gr pixels. The second pixel 24 and the fourth pixel 26 are R pixels. The fifth pixel 23C and the seventh pixel 25C are B pixels. The sixth pixel 24C and the eighth pixel 26C are Gb pixels.

In a second example, the first pixel 23 and the third pixel 25 are pixels of a first color. The second pixel 24 and the fourth pixel 26 are pixels of a second color. The fifth pixel 23C and the seventh pixel 25C are pixels of a third color. The sixth pixel 24C and the eighth pixel 26C are pixels of a fourth color. The first color, the second color, the third color, and the fourth color are different from one another.

Specifically, for example, the first pixel 23 and the third pixel 25 include color filters of the first color. The second pixel 24 and the fourth pixel 26 include color filters of the second color. The fifth pixel 23C and the seventh pixel 25C include color filters of the third color. The sixth pixel 24C and the eighth pixel 26C include color filters of the fourth color.

The pixels may be read in any order. The first pixel 23, the second pixel 24, the third pixel 25, and the fourth pixel 26 may be read first, and then the fifth pixel 23C, the sixth pixel 24C, the seventh pixel 25C, and the eighth pixel 26C may be read. The first pixel 23, the second pixel 24, the third pixel 25, the fourth pixel 26, the fifth pixel 23C, the sixth pixel 24C, the seventh pixel 25C, and the eighth pixel 26C may be read simultaneously.

Seventh Embodiment

The following describes a seventh embodiment. In the seventh embodiment, contents which are identical to those of the first embodiment are given the same signs and are not described.

Figure 27:
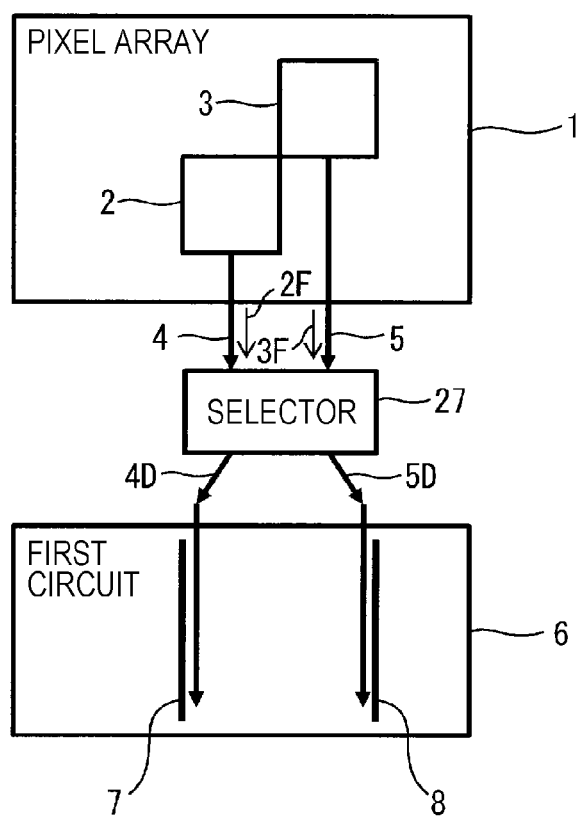
FIG. 27 is an explanatory diagram of signal paths according to a seventh embodiment.
Figure 28:
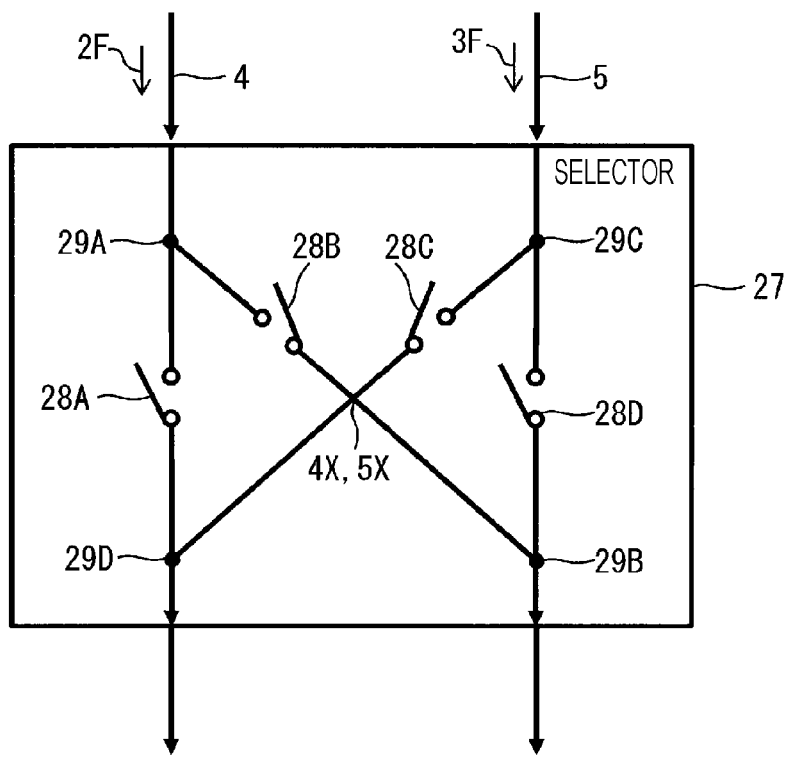
FIG. 28 is a configuration diagram of a selector according to the seventh embodiment.

As shown in FIG. 27, an imaging device according to the seventh embodiment includes a selector 27. In the seventh embodiment, a part of the first signal path 4 is constituted by the selector 27. A part of the second signal path 5 is constituted by the selector 27. FIG. 28 shows a configuration of the selector 27.

The seventh embodiment is configured such that in the first signal path 4 as seen in the plan view, a first node 29A, a first crossing portion 4X, a second node 29B, and a first extension portion 4Z are arranged in this order along a direction of flow 2F of the signal of the first pixel 2. In the second signal path 5 as seen in the plan view, a third node 29C, a second crossing portion 5X, a fourth node 29D, and a second extension portion 5Z are arranged in this order along a direction of flow 3F of the signal of the second pixel 3. The imaging device includes the selector 27. The selector 27 includes a first switch 28A, a second switch 28B, a third switch 28C, and a fourth switch 28D. The first switch 28A electrically connects the first node 29A and the fourth node 29D to each other. The second switch 28B electrically connects the first node 29A and the second node 29B to each other. The third switch 28C electrically connects the third node 29C and the fourth node 29D to each other. The fourth switch 28D electrically connects the third node 29C and the second node 29B to each other. The selector 27 makes it possible to switch paths of signals of pixels.

In other words, the first switch 28A is connected between the first node 29A and the fourth node 29D. The second switch 28B is connected between the first node 29A and the second node 29B. The third switch 28C is connected between the third node 29C and the fourth node 29D. The fourth switch 28D is connected between the third node 29C and the second node 29B.

The second switch 28B is provided on the first signal path 4. The third switch 28C is provided on the second signal path 5.

In this example, the selector 27 includes the first node 29A, the second node 29B, the third node 29C, and the fourth node 29D.

The first switch 28A, the second switch 28B, the third switch 28C, and the fourth switch 28D may be configured to be able to switch between an ON state and an OFF state by means of electric control. These switches may be fixed in an ON state or an OFF state. The control circuit 42 may control switching between the ON and OFF states of the first to fourth switches 28A to 28D.

In a case where the first switch 28A and the fourth switch 28D are in an OFF state and the second switch 28B and the third switch 28C are in an ON state, the signal of the first pixel 2 and the signal of the second pixel 3 flow as in the case of the first embodiment.

The following further describes how to use the selector 27.

For example, suppose a noise component in the second voltage line 8 is smaller than a noise component in the first voltage line 7. In this situation, there is a case where the pixels are read row by row. Specifically, there is a case where the first pixel 2 is read first and then the second pixel 3 is read. In this case, the second pixel 2 can be read first by setting the second switch 28B into an ON state and setting the first switch 28A, the third switch 28C, and the fourth switch 28D into an OFF state. Then, the second pixel 3 can be read by setting the fourth switch 28D into an ON state and setting the first switch 28A, the second switch 28B, and the third switch 28C into an OFF state. This enables both the signal of the first pixel 2 and the signal of the second pixel 3 to pass through the vicinity of the second voltage line 8 whose noise component is comparatively small. This makes it possible to read the first pixel 2 and the third pixel 3 with low noise. Control of a readout of these images is exercised, for example, by the row scanning circuit 41 and the control circuit 42.

Switching between ON and OFF of the first switch 28A, the second switch 28B, the third switch 28C, and the fourth switch 28D may be done by means of electric control after the imaging device has been configured. For example, it is also possible to actually measure the noise of the voltage lines 7 and 8 after having configured the imaging device and choose, according to a result of the actual measurement, whether the signals of the pixels pass through the vicinity of the voltage line 8 or pass through the vicinity of the voltage line 7. This makes it possible to reduce noise simply by electrically controlling the selector 27 without reconfiguring the imaging device.

Specific Example of Imaging System

The following describes a specific example of an imaging system. An imaging system according to this specific example is applicable to smartphones, video cameras, digital still cameras, surveillance cameras, on-board cameras, and the like.

Figure 29:
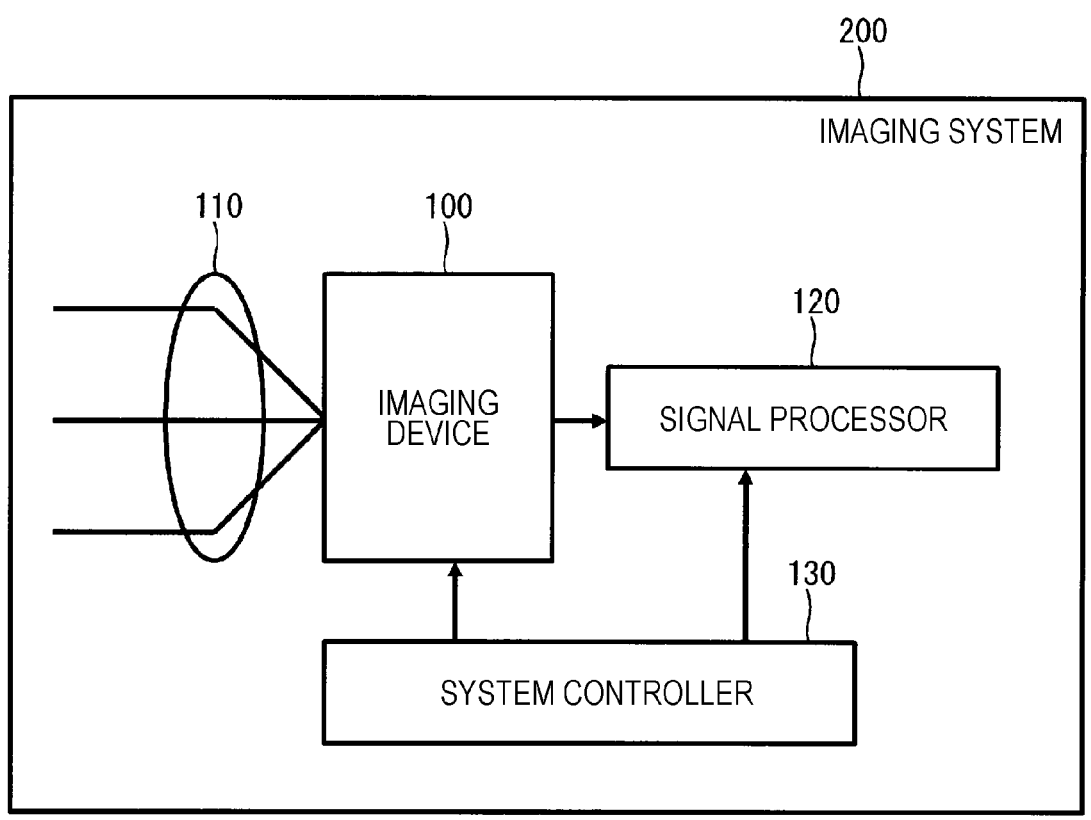
FIG. 29 is a block diagram of an imaging system according to a specific example.

FIG. 29 shows an imaging system 200 according to a specific example. The imaging system 200 includes a lens 110, an imaging device 100, a signal processor 120, and a system controller 130.

The lens 110 is an optical element for guiding incident light to a pixel array 1 of the imaging device 100.

The imaging device 100 converts image light formed on an imaging surface by the lens 110 into an electrical signal on a pixel-by-pixel basis and outputs the resulting image signal. The image signal is an aggregate of signals of the plurality of pixels of any one of the aforementioned embodiments. As the imaging device 100, the imaging device according to any one of the aforementioned embodiments may be utilized. Utilizing the imaging device according to any one of the aforementioned embodiments can contribute to forming an image with little noise.

The signal processor 120 is a circuit that performs various processes on the image signal generated by the imaging device 100. In one example, the image signal processed by the signal processor 120 is recorded, for example, as a still image or a moving image on a recording medium such as a memory. In another example, the image signal is displayed as a moving image on a monitor composed of a liquid crystal display or the like. The signal processor 120 may include the signal processing device 18 of FIG. 21.

The system controller 130 is a controller that drives the imaging device 100 and the signal processor 120.

Although the foregoing has described an imaging device and an imaging system according to embodiments of the present disclosure, the present disclosure is not limited to these embodiments.

For example, the division of functional blocks in a block diagram is an example. A plurality of functional blocks may be achieved as a single functional block. A single functional block may be divided into a plurality of functional blocks. Some functions may be transferred to other functional blocks.

The processors included in the respective devices according to the embodiments described above are typically achieved as LSIs, which are integrated circuits. These LSIs may be each individually formed into a single chip, or may be formed into a single chip so as to include some or all of the processors.

However, the technique of implementing an integrated circuit is not limited to LSI and may be achieved by using a dedicated circuit or a general-purpose processor. An FPGA (field-programmable gate array) that can be programmed after the manufacture of an LSI or a reconfigurable processor in which the connections and the settings of circuit cells disposed inside an LSI can be reconfigured may be used.

In each of the embodiments described above, some of the constituent elements may be achieved by executing a software program suitable to the constituent elements. The constituent elements may also be achieved by a program executor such as a CPU or a processor reading out and executing a software program recorded on a recording medium such as a hard disk or a semiconductor memory.

The crossing at the aforementioned portions 4X and 5X in the plan view is not essential. The technical features shown in the aforementioned embodiments and modifications may be replaced or combined as appropriate in order to solve some or all of the aforementioned problems or in order to achieve some or all of the aforementioned effects. Further, the technical features that are not described as essential herein may be deleted as appropriate.

An imaging device according to the present disclosure is applicable to various camera systems and sensor systems such as digital still cameras, cameras for medical use, surveillance cameras, on-board cameras, digital single-lens reflex cameras, and digital mirrorless single-lens cameras.

What is claimed is:

1. An imaging device comprising:
a plurality of pixels including a first pixel and a second pixel;
a first circuit including a first wiring part and a second wiring part, the first wiring part including one or more first voltage lines to which a first voltage is applied, the second wiring part including one or more second voltage lines to which a second voltage is applied, the second voltage being different from the first voltage;
a first signal path through which a signal of the first pixel flows; and
a second signal path through which a signal of the second pixel flows,
wherein when in a plan view a region closer to each of the one or more first voltage lines than any of the one or more second voltage lines is defined as a first region and a region closer to each of the one or more second voltage lines than any of the one or more first voltage lines is defined as a second region, the first signal path includes a first crossing portion where the first signal path crosses the second signal path in the plan view and a first extension portion that extends within the second region in the plan view and the second signal path includes a second crossing portion where the second signal path crosses the first signal path in the plan view and a second extension portion that extends within the first region in the plan view,
in a flow of the signal of the first pixel, the first crossing portion is located upstream of the first extension portion, and
in a flow of the signal of the second pixel, the second crossing portion is located upstream of the second extension portion.

2. The imaging device according to claim 1, wherein
the first voltage is a power supply voltage, and
the second voltage is a ground voltage.

3. The imaging device according to claim 1, wherein
the plurality of pixels constitute a pixel array having at least one row and a plurality of columns, and
a column of the pixel array to which the first pixel belongs and a column of the pixel array to which the second pixel belongs are adjacent to each other.

4. The imaging device according to claim 1, wherein
in the plan view, the one or more first voltage lines, the one or more second voltage lines, the first extension portion, and the second extension portion extend parallel to one another.

5. The imaging device according to claim 1, further comprising a multi-layer wiring layer including a first wiring layer and a second wiring layer that is different from the first wiring layer,
wherein the first wiring layer includes the first crossing portion, and
the second wiring layer includes the second crossing portion.

6. The imaging device according to claim 1, wherein
in the plan view, the first signal path further includes a first node and a second node,
in the plan view, the second signal path further includes a third node and a fourth node,
in the flow of the signal of the first pixel, the first node is located upstream of the first crossing portion and the second node is located between the first crossing portion and the first extension portion, and
in the flow of the signal of the second pixel, the third node is located upstream of the second crossing portion and the fourth node is located between the second crossing portion and the second extension portion,
the imaging device further comprising a selector,
wherein the selector includes
a first switch connected between the first node and the fourth node,
a second switch connected between the first node and the second node,
a third switch connected between the third node and the fourth node, and
a fourth switch connected between the third node and the second node.

7. The imaging device according to claim 1, further comprising a second circuit including a third wiring part including one or more voltage lines and a fourth wiring part including a plurality of voltage lines,
wherein the one or more voltage lines of the third wiring part include a third voltage line,
the plurality of voltage lines of the fourth wiring part include a fourth voltage line and a fifth voltage line that are adjacent to the third voltage line,
the third voltage line is located between the fourth voltage line and the fifth voltage line,
in the plan view, a pitch between the one or more first voltage lines and the one or more second voltage lines and a pitch between the third voltage line and each of the fourth and fifth voltage lines are different from each other,
when in the plan view a region between the third voltage line and the fourth voltage line is defined as a first pitch region and a region between the third voltage line and the fifth voltage line is defined as a second pitch region, the first signal path further includes a first pitch portion that extends within the first pitch region in the plan view and the second signal path further includes a second pitch portion that extends within the second pitch region in the plan view,
in the flow of the signal of the first pixel, the first pitch portion is located upstream of the first crossing portion, and
in the flow of the signal of the second pixel, the second pitch portion is located upstream of the second crossing portion.

8. The imaging device according to claim 1, wherein the first circuit further includes a first transistor of a first conductivity type and a second transistor of a second conductivity type that is different from the first conductivity type,
the first transistor is connected to any of the one or more first voltage lines, and
the second transistor is connected to any of the one or more second voltage lines.

9. The imaging device according to claim 1, further comprising a second circuit,
wherein the first circuit further includes a first transistor of a first conductivity type and a second transistor of a second conductivity type that is different from the first conductivity type,
the second circuit includes a third transistor of the first conductivity type and a fourth transistor of the second conductivity type,
when a center of gravity of a gate of the first transistor and a gate of the second transistor is defined as a first center of gravity and a center of gravity of a gate of the third transistor and a gate of the fourth transistor is defined as a second center of gravity, a direction of arrangement of the first transistor and the second transistor and a direction of arrangement of the third transistor and the fourth transistor are different from each other in the plan view,
in the plan view, the first signal path includes a portion that is closest to the second center of gravity and a portion that is closest to the first center of gravity,
in the plan view, the second signal path includes a portion that is closest to the second center of gravity and a portion that is closest to the first center of gravity,
in the flow of the signal of the first pixel, the portion of the first signal path that is closest to the second center of gravity is located upstream of the portion of the first signal path that is closest to the first center of gravity, and
in the flow of the signal of the second pixel, the portion of the second signal path that is closest to the second center of gravity is located upstream of the portion of the second signal path that is closest to the first center of gravity.

10. The imaging device according to claim 1, wherein the plurality of pixel include a first OB pixel, the first OB pixel being an optical black pixel,
the imaging device further comprising:
a signal processing circuit; and
a first OB path through which a signal of the first OB pixel flows,
wherein in the plan view, the first OB path includes a first OB extension portion that extends within the second region, and
the signal processing circuit performs an optical black correction on the signal of the first pixel with use of the signal of the first OB pixel, the signal of the first pixel having passed through the first extension portion, the signal of the first OB pixel having passed through the first OB extension portion.

11. The imaging device according to claim 1, wherein the plurality of pixels include a third pixel,
the imaging device further comprising a third signal path through which a signal of the third pixel flows,
wherein in the plan view, the third signal path includes a third extension portion that extends within the second region.

12. The imaging device according to claim 11, wherein the plurality of pixels include a fourth pixel,
the imaging device further comprising a fourth signal path through which a signal of the fourth pixel flows,
wherein in the plan view, the fourth signal path includes a fourth extension portion that extends within the first region.

13. The imaging device according to claim 12, wherein in the plan view, the third signal path includes a portion that extends from the third pixel to the second region,
in the plan view, the fourth signal path includes a portion that extends from the fourth pixel to the first region, and
the portion that extends from the third pixel to the second region does not cross the portion that extends from the fourth pixel to the first region.

14. The imaging device according to claim 11, wherein the first pixel includes a first color filter,
the second pixel includes a second color filter,
the third pixel includes a third color filter,
the first color filter and the third color filter are color filters of a first color, and
the second color filter is a color filter of a second color that is different from the first color.

15. The imaging device according to claim 11, wherein the first pixel and the third pixel are each a first type of pixel selected from among four types of pixel consisting of an R pixel, a B pixel, a Gr pixel, and a Gb pixel,
the second pixel is a second type of pixel selected from among four types of pixel consisting of an R pixel, a B pixel, a Gr pixel, and a Gb pixel, and
the first type of pixel and the second type of pixel are different from each other.

16. The imaging device according to claim 11, further comprising a signal processing circuit,
wherein the signal processing circuit performs, on both the signal of the first pixel and the signal of the third pixel, corrections that reduce noise components that are superimposed in the second region, the signal of the first pixel having passed through the first extension portion, the signal of the third pixel having passed through the third extension portion.

17. The imaging device according to claim 11, wherein the plurality of pixel include a first OB pixel, the first OB pixel being an optical black pixel,
the imaging device further comprising:
a signal processing circuit; and
a first OB path through which a signal of the first OB pixel flows,
wherein in the plan view, the first OB path includes a first OB extension portion that extends within the second region, and
the signal processing circuit performs an optical black correction on the signal of the first pixel with use of the signal of the first OB pixel, the signal of the first pixel having passed through the first extension portion, the signal of the first OB pixel having passed through the first OB extension portion.

18. An imaging system comprising:
the imaging device according to claim 1; and
a signal processing device provided outside the imaging device,
wherein the plurality of pixel include a first OB pixel, the first OB pixel being an optical black pixel,
the imaging device further includes a first OB path through which a signal of the first OB pixel flows,
in the plan view, the first OB path includes a first OB extension portion that extends within the second region, and
the signal processing device performs an optical black correction on the signal of the first pixel with use of the signal of the first OB pixel, the signal of the first pixel having passed through the first extension portion, the signal of the first OB pixel having passed through the first OB extension portion.

19. An imaging system comprising:
the imaging device according to claim 11; and
a signal processing device provided outside the imaging device,
wherein the signal processing device performs, on both the signal of the first pixel and the signal of the third pixel, corrections that reduce noise components that are superimposed in the second region, the signal of the first pixel having passed through the first extension portion, the signal of the third pixel having passed through the third extension portion.

* * * * *